(12) United States Patent
King

(10) Patent No.: US 10,180,453 B2
(45) Date of Patent: Jan. 15, 2019

(54) INCREASED POWER EFFICIENCY IN DRIVER CIRCUITS

(71) Applicant: Jeffrey Allen King, San Diego, CA (US)

(72) Inventor: Jeffrey Allen King, San Diego, CA (US)

(73) Assignee: Analog Test Engines, San Diego, CA (US)

( * ) Notice: Subject to any disclaimer, the term of this patent is extended or adjusted under 35 U.S.C. 154(b) by 622 days.

(21) Appl. No.: 14/845,776

(22) Filed: Sep. 4, 2015

(65) Prior Publication Data

US 2017/0067959 A1    Mar. 9, 2017

(51) Int. Cl.
*G01R 31/28* (2006.01)
*H03K 17/00* (2006.01)
*H02M 1/00* (2006.01)

(52) U.S. Cl.
CPC ..... *G01R 31/2834* (2013.01); *G01R 31/2879* (2013.01); *H03K 17/00* (2013.01); *H02M 1/00* (2013.01)

(58) Field of Classification Search
CPC ................ G01R 31/28; G01R 31/2834; G01R 31/2879; H03K 17/00; H02M 1/00
USPC ....................................................... 324/750.01
See application file for complete search history.

(56) References Cited

U.S. PATENT DOCUMENTS

| | | | | |
|---|---|---|---|---|
| 2003/0080771 | A1* | 5/2003 | Johnson | H03F 3/45475 327/538 |
| 2003/0107395 | A1* | 6/2003 | Kawasaki | G01R 31/3004 324/762.01 |
| 2007/0296400 | A1* | 12/2007 | Andoh | G01R 31/2839 324/142 |

* cited by examiner

*Primary Examiner* — Melissa Koval
*Assistant Examiner* — Courtney McDonnough

(57) ABSTRACT

Methods and systems for sourcing and/or sinking current from power supplies of differing voltage levels. A driving circuit may, for example, receive power from first and second power supplies, where the first power supply provides current to the driving circuit at a first voltage level and the second power supply provides current to the driving circuit at a second voltage level, and where the first voltage is greater than the second voltage. As a result, the first power supply allows the driving circuit to provide current over a wide voltage range, and the second power supply allows the driving circuit to provide current at lower voltages with less power consumption.

20 Claims, 17 Drawing Sheets

INCREASED POWER EFFICIENCY IN DRIVER CIRCUITS

BACKGROUND

Field

The described technology relates to systems and methods which provide increased power efficiency in electronic devices, and more particularly to driver circuits.

Description of the Related Technology

Automatic Test Equipment (ATE) is a computer based system that tests a device, known as a Device Under Test (DUT). The ATE can be programmed to provide power signals, reference signals, and input signals to the DUT. The ATE can also be programmed to receive signals, such as voltages and currents, generated by the DUT in response to the input from the ATE. The ATE can compare the received signals with predetermined values to determine whether the DUT is operating according to specifications. Testing and diagnosing faults with ATE can be performed on wafer die, packaged electronic parts, or electronic systems.

Because the ATE is a general purpose tester, the ATE is preferably capable of generating signals and power voltages over a wide voltage range. To accommodate this capability signal and power drivers of the ATE are powered with voltage supplies which provide a voltage difference at least as great as the desired output voltage range. For applications which require only a limited portion of the capability range, unnecessary power consumption occurs within the signal and power drivers.

For example, for an ATE power driver capable of generating a voltage supply with a range of +/−15 volts, the power driver may receive power from a +15 V power supply and from a −15 V power supply. If the power driver is used to supply 2 amps to a DUT at +5 V, 2 A×5 V=10 watts is delivered to the DUT. However, the 2 amps is ultimately sourced by the +15 V power supply. Therefore, 2 A×15 V=30 W is consumed to provide the 10 W to the DUT.

SUMMARY OF CERTAIN INVENTIVE ASPECTS

Certain inventive aspects include methods and systems for sourcing and/or sinking current from power supplies of differing voltage levels. A driving circuit may, for example, receive power from first and second power supplies, where the first power supply provides current to the driving circuit at a first voltage level and the second power supply provides current to the driving circuit at a second voltage level, and where the first voltage is greater than the second voltage. As a result, the first power supply allows the driving circuit to provide current over a wide voltage range, and the second power supply allows the driving circuit to provide current at lower voltages with less power consumption.

DETAILED DESCRIPTION OF CERTAIN INVENTIVE EMBODIMENTS

Various aspects and features of methods and devices are described herein with reference to the accompanying drawings, which show certain embodiments. The described embodiments may be modified in various ways, without departing from the spirit or scope of the present invention or inventions. In addition, the described embodiments have multiple features and aspects, no single one of which is solely responsible for the desirable characteristics of the embodiments. Furthermore, no single feature or aspect is essential to practicing the methods and systems described herein. Additionally, various features and aspects of the embodiments may be combined in embodiments not specifically described. For example, one or more features described with reference to one embodiment may be combined with one or more features described with reference to another embodiment.

Various inventive aspects of certain embodiments of systems and methods for providing signals and power in electronic circuits are discussed. The aspects, which are discussed herein in the context of ATE devices, may be applied to other electronic devices as well. In some embodiments, the systems and methods provide reference voltages which compensate for variations in temperature dependencies of the ATE circuitry and reference voltage generation circuitry.

Figure 1:
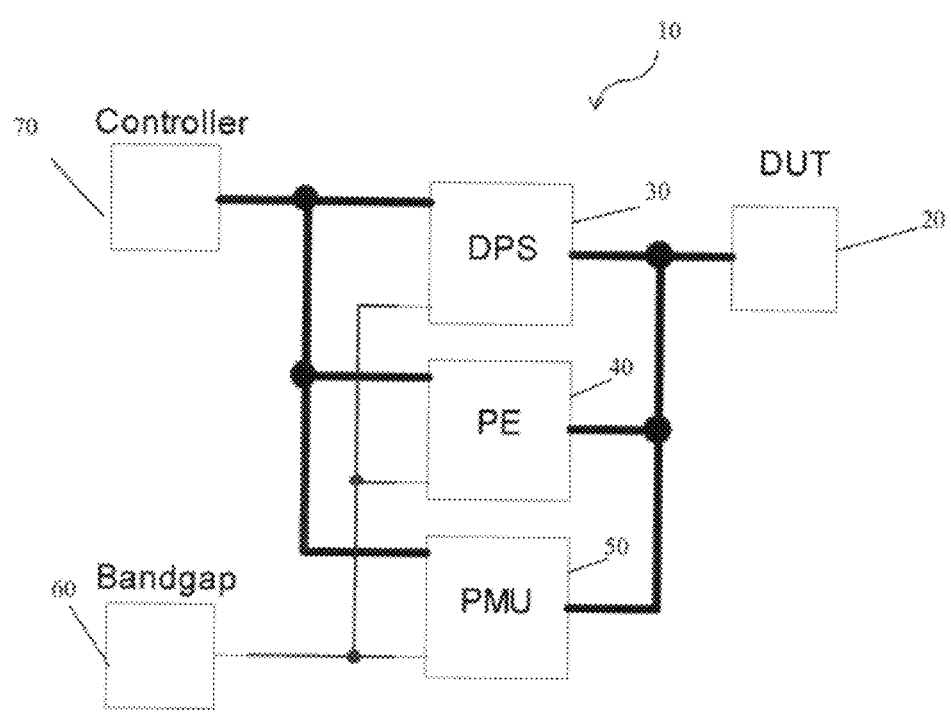
FIG. 1 is a block diagram schematic view of an embodiment of an ATE system.

FIG. 1 is a block diagram schematic view of an embodiment of an ATE system 10. The various aspects discussed herein in may be applied to other ATE systems and other electronic devices. The ATE system 10 of this embodiment is connected to a device under test (DUT) 20 to be tested, and includes a DUT power supply (DPS) 30, pin electronics (PE) 40, a parametric measurement unit (PMU) 50, a bandgap reference generator 60, and a controller 70.

The controller 70 is programmable, and is configured to provide signals to each of the DPS 30, the PE 40, and the PMU 50 to control the operation thereof. The controller 70 may be programmed so as to cause the ATE system 10 to provide power and input stimulus, or signals, to the DUT 20, to receive electrical responses from the DUT 20, and to compare the DUT responses with programmed expected values, or test limits. Based on the comparisons, the ATE system 10 may determine whether the DUT 20 functions according to design specifications.

The DPS 30 is configured to provide, for example, power supply voltages to the DUT 20. The DPS 30 may also be configured to supply reference voltages and reference currents to the DUT 20. The values of the power supply and reference voltages and currents may be based on input received from the controller 70.

The PE 40 is configured to provide digital signals to the DUT 20. For example, the PE 40 may include or may be connected to a pattern memory, which stores digital data representing signals for the DUT 20. Based on signals from the controller 70, the PE 40 accesses data from the pattern memory, and provides digital signals to the DUT 20 corresponding with the digital data in the pattern memory. The timing characteristics of the digital signals, for example, the frequency or the duration of the digital signals may be determined based on signals from the controller 70 and the data in the pattern memory.

In this embodiment, the PE 40 is also configured to receive digital signals from the DUT 20. For example, the PE 40 may include or may be connected to a DUT output memory, which stores data representing signals from the DUT 20. Based on signals from the controller 70, the PE records signals from the DUT 20, and provides data to the output memory representing the recorded signals. The timing characteristics of the recorded data, for example, time points when the data is recorded, may be determined based on signals from the controller 70.

The PMU 50 is configured to determine values of, for example, voltages and currents output from the DUT 20. Accordingly, the PMU 50 may include or may be connected to one or more analog to digital converters, which are configured to receive a voltage or a current from the DUT 20 and to generate a digital value representing the voltage or current. The digital value may then be stored in the DUT output memory. The timing characteristics of the measurements, for example, time points when the measurements are taken, may be determined based on signals from the controller 70.

The DPS 30, the PE 40, and the PMU 50 include numerous circuits which each use one or more reference voltages or currents to provide accurate and precise performance. In this example, the reference voltages are generated based on one or more voltages generated by bandgap reference generator 60. In some embodiments, a voltage generator other than a bandgap reference generator may be used.

Figure 2:
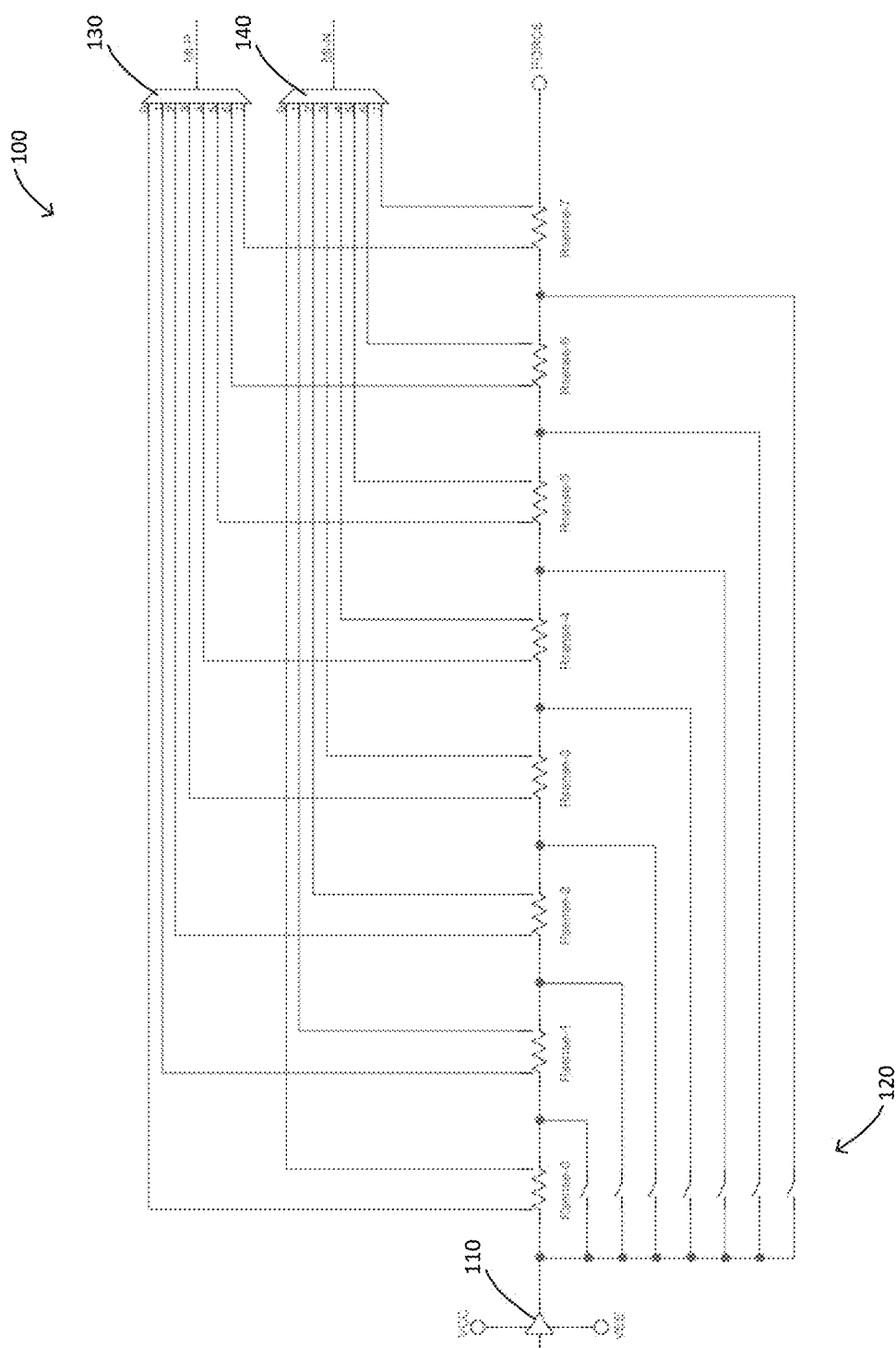
FIG. 2 is a schematic diagram of a force/sense circuit.

FIG. 2 is a schematic diagram of a force/sense circuit 100. Force/sense circuit 100 may, for example, be part of DPS 30 or PMU 50. In some embodiments, force/sense circuit 100 is included, for example, in a feedback loop circuit configured to provide an amount of current to a DUT which induces a desired voltage at the DUT, and to provide a voltage signal corresponding to the amount of current required to induce the desired voltage at the DUT, where the feedback loop receives the desired voltage at an input.

Force/sense circuit 100 includes analog buffer 110, switches 120, sense resistors Rsense-0-Rsense-7, and first and second multiplexers 130 and 140. Force/sense circuit 100 receives an analog voltage, and generates a force voltage at node FORCE. The force voltage may be provided, for example, to DUT 20. Force/sense circuit 100 also generates a differential signal across MI-P and MI-N corresponding with the amount of current provided to or sunk from DUT 20.

Analog buffer 110 may, for example, have a common source output or a source follower output. In some embodiments, analog buffer 110 is, is an output stage of, or is a buffer for a differential amplifier which receives a voltage at its negative input terminal based on the voltage at DUT 20, and receives a voltage at its positive input terminal based on the voltage to be supplied to DUT 20. Other configurations may alternatively be used.

Sense resistors Rsense-0-Rsense-7 are serially connected, and are used to generate the differential signal corresponding with the amount of current provided to or sunk from DUT 20. Sense resistors Rsense-0-Rsense-7 may have progressively smaller resistance values. For example, Rsense-0 may have 10 times the resistance value of Rsense-1, 100 times the resistance value of Rsense-2, and so forth.

Switches 120 are used to selectively shunt sense resistors Rsense-0-Rsense-6. Which of the sense resistors are shunted is determined by control signals controlling switches 120. The control signals are used to set a sensing range. For example, if force/sense circuit 100 applies a maximum current, sense resistors Rsense-0-Rsense-6 are shunted, and the maximum current flows through only Rsense-7 of the sense resistors. Alternatively, if force/sense circuit 100 applies a minimum current, no sense resistors are shunted, and the minimum current flows through all of sense resistors Rsense-0-Rsense-7.

First and second multiplexers 130 and 140 are used to select which of the sense resistors is used to generate the differential signal corresponding with the current provided to or sunk from DUT 20. For example, in this embodiment, the sense resistor selected is the sense resistor having the greatest resistance value and through which current from or to analog buffer 110 flows to or from DUT 20. The first and second multiplexers 130 and 140 are driven with control signals which communicate the appropriate selection to be made.

The control signals for the switches 120 and for the first and second multiplexers 130 and 140 are generated by a processor, such as controller 70 (not shown in FIG. 2), which determines which current range the force/sense circuit 100 is to sense.

In this embodiment, all current provided to or sunk from DUT 20 by force/sense circuit 100 is provided by power supply VCC or is sunk by power supply VEE.

Figure 3:
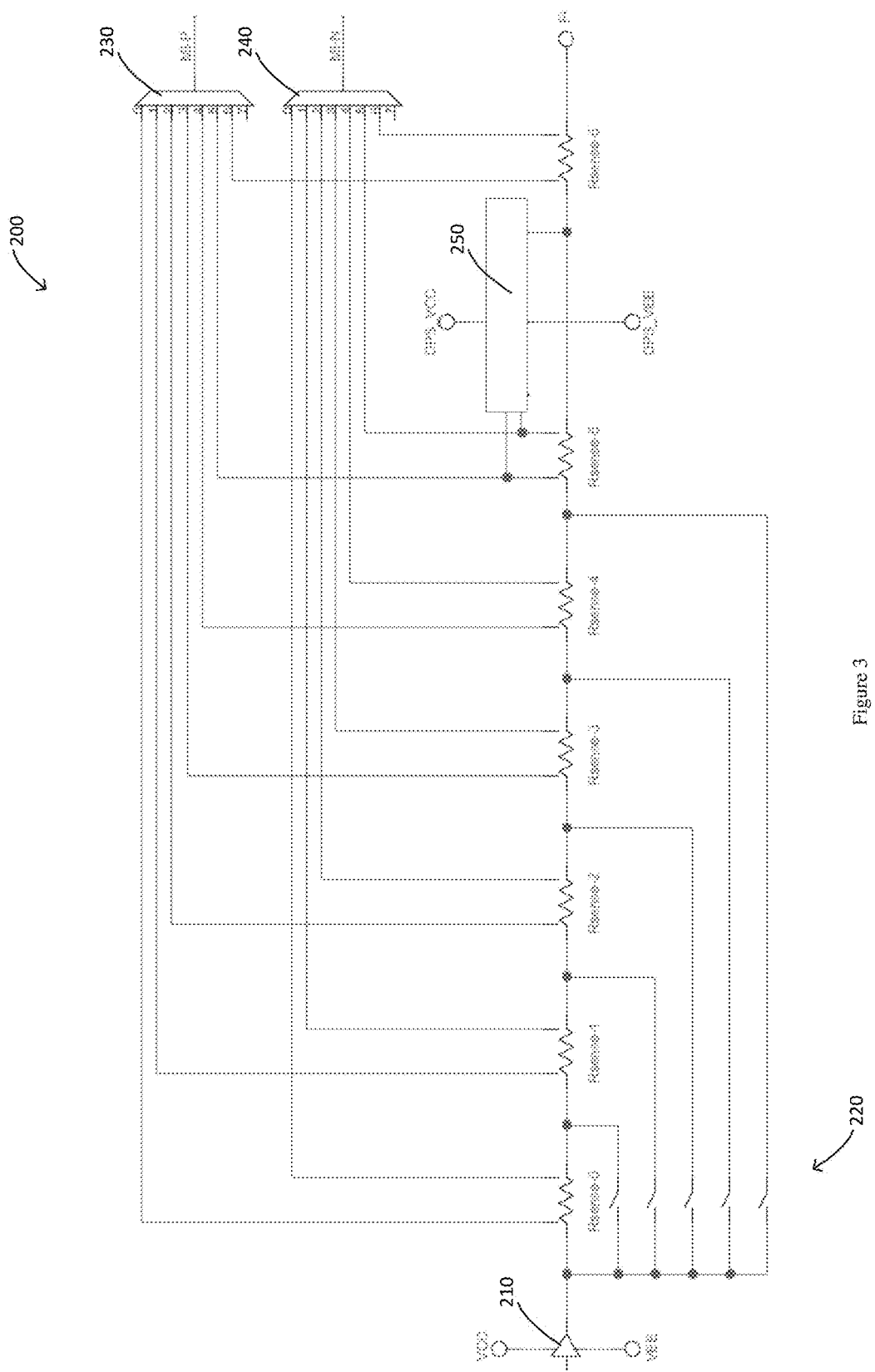
FIG. 3 is a schematic block diagram of a force/sense circuit.

FIG. 3 is a schematic block diagram of a force/sense circuit 200. Force/sense circuit 200 may be used instead of force/sense circuit 100 of FIG. 2, for example, in DPS 30 or PMU 50.

Force/sense circuit 200 includes analog buffer 210, switches 220, sense resistors Rsense-0-Rsense-6, first and second multiplexers 230 and 240, and current injector circuit 250. Force/sense circuit 200 receives an analog voltage, and generates a force voltage at node FORCE. The force voltage may be provided, for example, to DUT 20. Force/sense circuit 200 also generates a differential signal across MI-P and MI-N corresponding with the amount of current provided to or sunk from DUT 20.

Analog buffer 210 may be similar to analog buffer 110, discussed above.

Sense resistors Rsense-0-Rsense-6 of this embodiment have similar characteristics of Rsense-0-Rsense-7 of force/sense circuit 100 shown in FIG. 2.

Switches 220 are used to selectively shunt sense resistors Rsense-0-Rsense-4. Which of the sense resistors are shunted is determined by control signals controlling switches 220. The control signals are used to set a sensing range. For example, if force/sense circuit 200 applies a maximum current, sense resistors Rsense-0-Rsense-4 are shunted, and the maximum current flows through only Rsense-5 and Rsense-6 of the sense resistors. Alternatively, if force/sense circuit 200 applies a minimum current, no sense resistors are shunted, and the minimum current flows through all of sense resistors Rsense-0-Rsense-7.

First and second multiplexers 230 and 240 are used to select which of the sense resistors is used to generate the differential signal corresponding with the current provided to or sunk from DUT 20. For example, in this embodiment, the sense resistor selected is the sense resistor having the greatest resistance value and through which current from or to analog buffer 110 flows to or from DUT 20, unless the current injector circuit 250 is used, in which case, Rsense-6 is selected. The first and second multiplexers 230 and 240 are driven with control signals which communicate the appropriate selection to be made.

Current injector circuit 250 sources current to or sinks current from DUT 20 through sense resistor Rsense-6. The amount of current sourced or sunk is based on the voltage difference across sense resistor Rsense-5, which corresponds with the current from or to analog buffer 210. In some embodiments, current injector circuit 250 is configured to source or sink current to or from DUT, where the current sourced or sunk is about 1, 2, 5, 10, 50, or 100 times the current of sense resistor Rsense-5.

In this embodiment, when current injector circuit 250 is used, some current provided to or sunk from DUT 20 by force/sense circuit 200 is provided by power supply VCC1 or is sunk by power supply VEE1, and some current provided to or sunk from DUT 20 by force/sense circuit 200 is provided by power supply VCC2 or is sunk by power supply VEE2. Because the voltage of VCC1 is greater than the voltage of VCC2, less power is used to source current from VCC2 than from VCC1. Similarly, because the magnitude of the voltage of VEE1 is greater than the magnitude of the voltage of VEE2, less power is used to sink current to VEE2 than to VEE1. As a result, use of the current injector circuit 250 reduces power consumption of force/sense circuit 200 while driving the same voltage and power to the DUT 20.

In addition, because current injector circuit 250 sources or sinks some of the current to or from DUT 20, less current is conducted through Rsense-5. Consequently, the voltage drop across Rsense-5 is correspondingly reduced. As a result, force/sense circuit 200 has an output voltage range, which is correspondingly increased.

In some embodiments, VCC1 is equal to VCC2 and VEE1 is equal to VEE2. In such embodiments, use of the current injector circuit 250 does not result in reduced our consumption. However, in such embodiments, use of the current injector circuit 250 does result in improved output voltage range.

The control signals for the switches 220 and for the first and second multiplexers 230 and 240 are generated by a processor, such as controller 70 (not shown in this embodiment), which determines which current range the force/sense circuit 200 is to sense. The processor also determines whether to turn on the current injector circuit 250, and provides an appropriate control signal to the current injector circuit 250. The processor may determine to turn on the current injector circuit 250 in response to the voltage to be supplied to DUT 20 being within a specified voltage range. In some embodiments, the processor is configured to turn on the current injector circuit 250 in response to the voltage to be supplied to DUT 20 being within a specified voltage range and the magnitude of the current being supplied to or sunk from DUT 20 being greater than a threshold.

Figure 4:
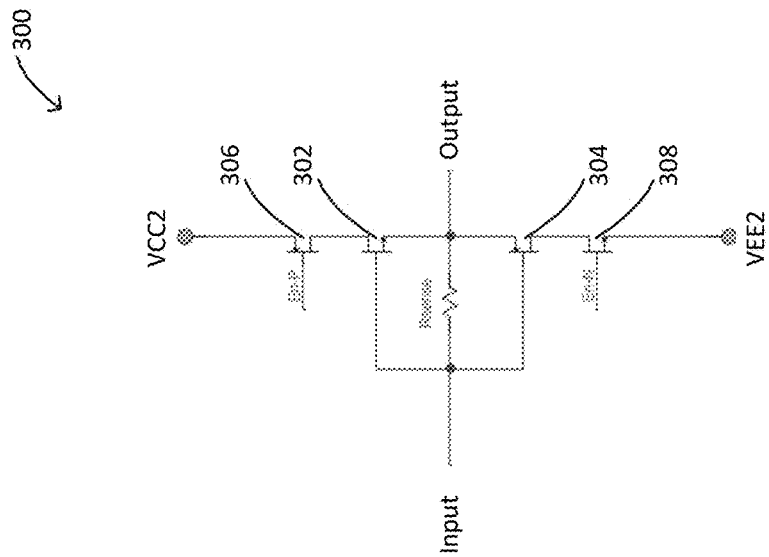
FIG. 4 is a schematic diagram of a current injector circuit.

FIG. 4 is a schematic diagram of a current injector circuit 300 connected across an example sense resistor Rsense. Current injector circuit 300 may, for example, be used in current injector circuit 250 of FIG. 3, discussed above. Sense resistor Rsense may correspond, for example, with sense resistor Rsense-5 of FIG. 3.

Current injector circuit 300 includes P injector 302 and N injector 304. In this embodiment, current injector circuit 300 also includes P enable transistor 306 and N enable transistor 308. In some embodiments, P enable transistor 306 and N enable transistor 308 are not used. In such embodiments, the drain of P injector 302 may be directly connected to power supply VCC2, and the drain of N injector 304 may be directly connected to power supply VEE2.

As shown in FIG. 4, the input side of sense resistor Rsense is connected to the gates of P injector 302 and N injector 304. In addition, the sources of P injector 302 and N injector 304 are connected to the output side of the sense resistor Rsense.

In operation, in response to a current being driven from an analog buffer to a DUT through sense resistor Rsense, a voltage drop develops across sense resistor Rsense. If the magnitude of the current is sufficiently low, the voltage drop is less than the threshold voltage required to turn on P injector 302 or N injector 304. However, if the magnitude of the current is sufficient, the voltage drop across sense resistor Rsense is greater not to turn on either P injector 302 N injector 300, depending on the polarity or direction of the current.

Therefore, for current magnitudes less than a threshold, the current is sourced or sunk to or from the DUT through sense resistor Rsense, and current injector circuit 300 does not source or sink current to or from the DUT. However, for current magnitudes greater than the threshold, current about equal to the threshold is sourced or sunk to or from the DUT through sense resistor Rsense, and current injector circuit 300 sources or sinks the current to or from the DUT greater than the threshold.

When included, P enable transistor 306 and N enable transistor 308 are used to selectively enable current injector circuit 300. Contract signals are selected by the gates of P enable transistor 306 and N enable transistor 308 selectively connect the drains of P injector 302 and N injector 304 to their respective power supplies.

Figure 5:
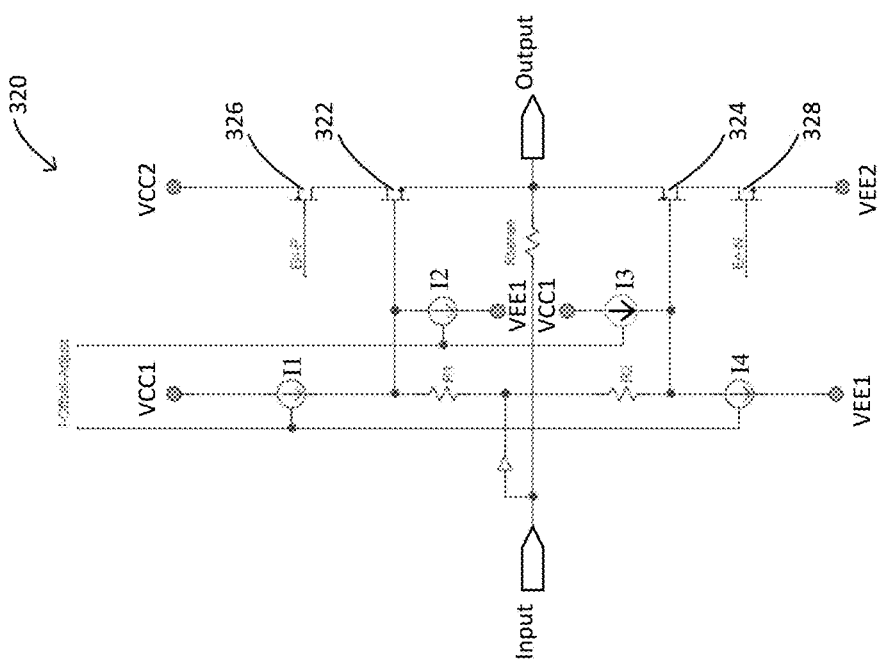
FIG. 5 is a schematic diagram of a current injector circuit.

FIG. 5 is a schematic diagram of a current injector circuit 300 connected across an example sense resistor Rsense. Current injector circuit 300 may, for example, be used in current injector circuit 250 of FIG. 3, discussed above. Sense resistor Rsense may correspond, for example, with sense resistor Rsense-5 of FIG. 3.

Current injector circuit 320 includes P injector 322 and N injector 324. In this embodiment, current injector circuit 320 also includes P enable transistor 326 and N enable transistor 328. P injector 322 and N injector 324 are similar to P injector 302 and N injector 304 of current injector circuit 300, shown in FIG. 4. In addition, P enable transistor 326 and N enable transistor 328 are similar to P enable transistor 306 and N enable transistor 308 of current injector circuit 300, shown in FIG. 4.

Current injector circuit 320 also includes analog buffer 330, level shift resistors R1 and R2, and controllable current sources I1, I2, I3, and I4.

Analog buffer 330 is configured to force a voltage (VBuf) at node connecting resistors R1 and R2. The forced voltage corresponds to the voltage at the input side of sense resistor Rsense.

Resistor R1 and current sources I1 and I2 collectively induce a voltage the gate of P injector 322. The induced voltage is equal to $VBuf+(iI1-iI2) \times RR1$, where VBuf is equal to the output voltage of analog buffer 330, i1 is the current of current source I1, i2 is equal to the current of current source I2, and RR1 is equal to the resistance of resistor R1. Accordingly, the voltage at the gate of the P injector 322 is level shifted by P level shift voltage (Vpls), (i1-i2)×RR1.

Resistor R2 and current sources I3 and I4 collectively induce a voltage the gate of N injector 324. The induced voltage is equal to VBuf−(i4-i3)×RR2, where VBuf is equal to the output voltage of analog buffer 330, i3 is the current of current source I3, i4 is equal to the current of current source I4, and RR2 is equal to the resistance of resistor R2. Accordingly, the voltage at the gate of the N injector 324 is level shifted by N level shift voltage (Vnls), (i3-i4)×RR2.

The currents of current sources I1, I2, I3, and I4 are controlled by signals I-Offset Adjust. In this embodiment, the currents of current sources I1 and I4 are controlled by a first signal, and the currents of current sources I2 and I3 are controlled by a second signal. In some embodiments, the currents of current sources I1 and I2 are controlled by a first signal, and the currents of current sources I3 and I4 are controlled by a second signal. In some embodiments, the current of each of current sources I1, I2, I3, and I4 is controlled by a distinct I-Offset Adjust signal. In some embodiments, the current of all of current sources I1, I2, I3, and I4 are controlled by a single I-Offset Adjust signal.

Figure 6:
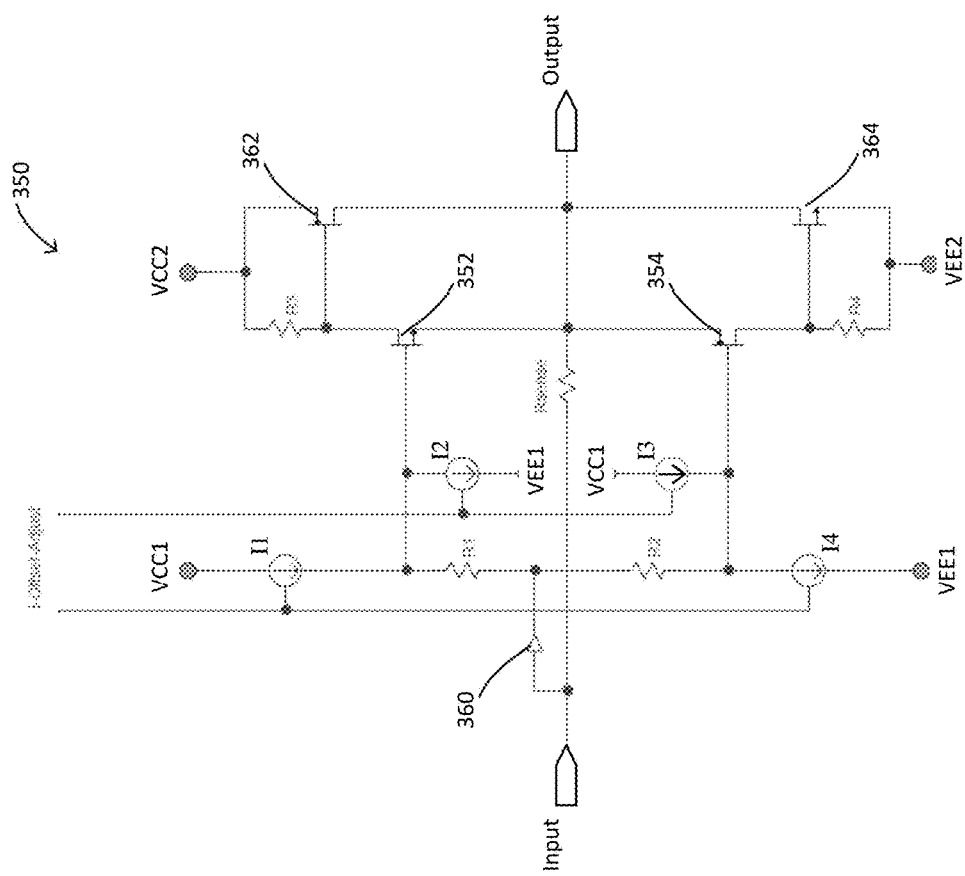
FIG. 6 is a schematic diagram of a current injector circuit.

FIG. 6 is a schematic diagram of a current injector circuit 350 connected across an example sense resistor Rsense. Current injector circuit 350 may, for example, be used in current injector circuit 250 of FIG. 3, discussed above. Sense resistor Rsense may correspond, for example, with sense resistor Rsense-5 of FIG. 3.

Current injector circuit 350 includes P injector 352 and N injector 354. P injector 352 and N injector 354 are similar to P injector 322 and N injector 324 of current injector circuit 320, shown in FIG. 5.

Current injector circuit 350 also includes analog buffer 360, level shift resistors R1 and R2, and controllable current sources I1, I2, I3, and I4. Analog buffer 360, level shift resistors R1 and R2, and controllable current sources I1, I2, I3, and I4 are respectively similar to analog buffer 330, level shift resistors R1 and R2, and controllable current sources I1, I2, I3, and I4 of current injector circuit 320, shown in FIG. 5.

Current injector circuit 350 also includes R3 and R4, P amplifier transistor 362, and N amplifier transistor 364.

N injector 352, resistor R3, and P amplifier transistor 362 collectively form an amplifier configured to source current to the output. N injector 352 sources current as discussed above with reference to N injectors 302 and 322. In addition, the current sourced by N injector 352 causes a voltage drop at the gate of P amplifier transistor 362 because of resistor R3. In response to the voltage at its gate, P amplifier transistor 362 additionally sources current to the output.

Similarly, P injector 354, resistor R4, and N amplifier transistor 364 collectively form an amplifier configured to sink current from the output. P injector 354 sinks current as discussed above with reference to P injectors 304 and 324. In addition, the current sunk by P injector 354 causes a voltage increase at the gate of the N amplifier transistor 364 because of resistor R4. In response to the voltage at its gate, N amplifier transistor 364 additionally sinks current from the output.

Figure 7:
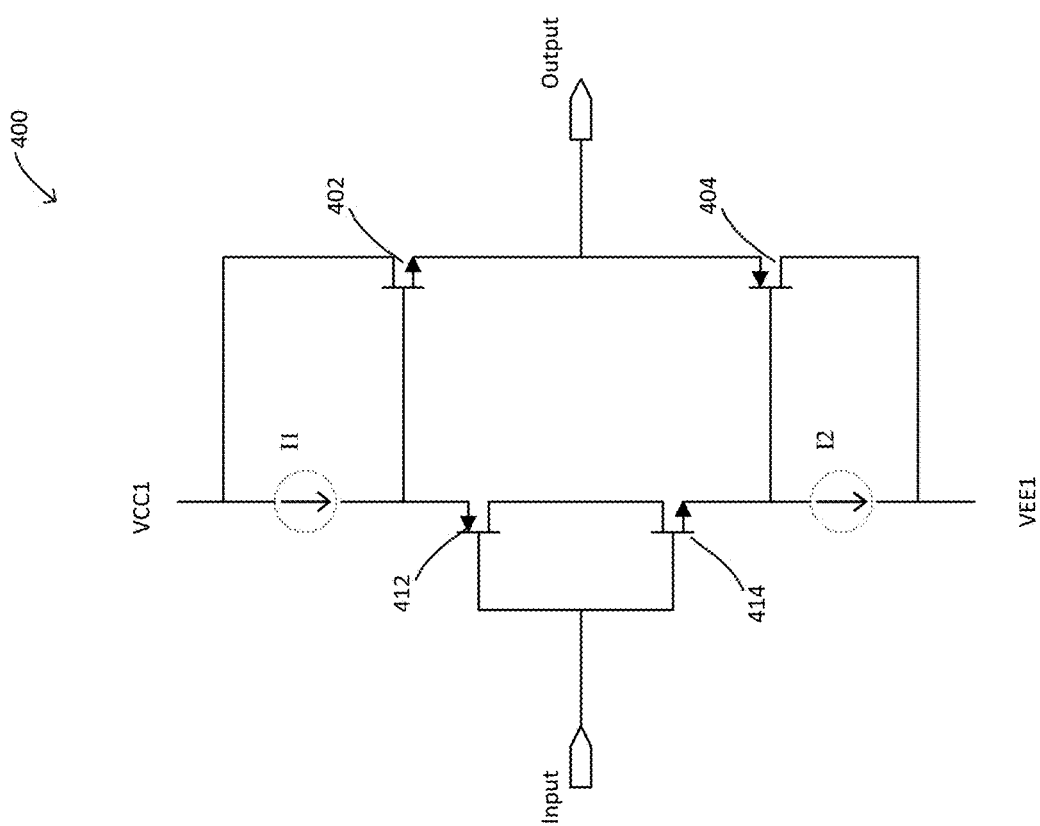
FIG. 7 is a schematic illustration of an analog buffer.

FIG. 7 is a schematic illustration of an analog buffer 400. Analog buffer 400 may, for example, be used as or in any of the analog buffers discussed elsewhere herein. In alternative embodiments, other buffer architectures may be used as or in any of the analog buffers discussed elsewhere herein. For example, in some embodiments, a differential amplifier in a voltage follower configuration may be used.

Analog buffer 400 includes source N transistor 402, source P transistor 412, current source I1, sink P transistor 404, sink P transistor 414, and current source I2.

Source N transistor 402, source P transistor 412, and current source I1 collectively form a current source buffer. Based on the input voltage, the threshold voltage of source P transistor 412, and the current of current source I1, a voltage is induced at the gate of source N transistor 402. As a source follower, source N transistor 402 sources current to the output node.

Similarly, sink P transistor 404, sink N transistor 414, and current source I2 collectively form a current sink buffer. Based on the input voltage, the threshold voltage of sink N transistor 414, and the current of current source I2, a voltage is induced at the gate of sink P transistor 404. As a source follower, sink P transistor 404 sinks current from the output node.

In some embodiments, one or both of current sources I1 and I2 of FIG. 7 are controllable with a control signal, for example, to respectively adjust an offset of the current source buffer and the current sink buffer.

The current sources discussed herein may be any current source, as understood by one of skill in the art.

Figure 8:
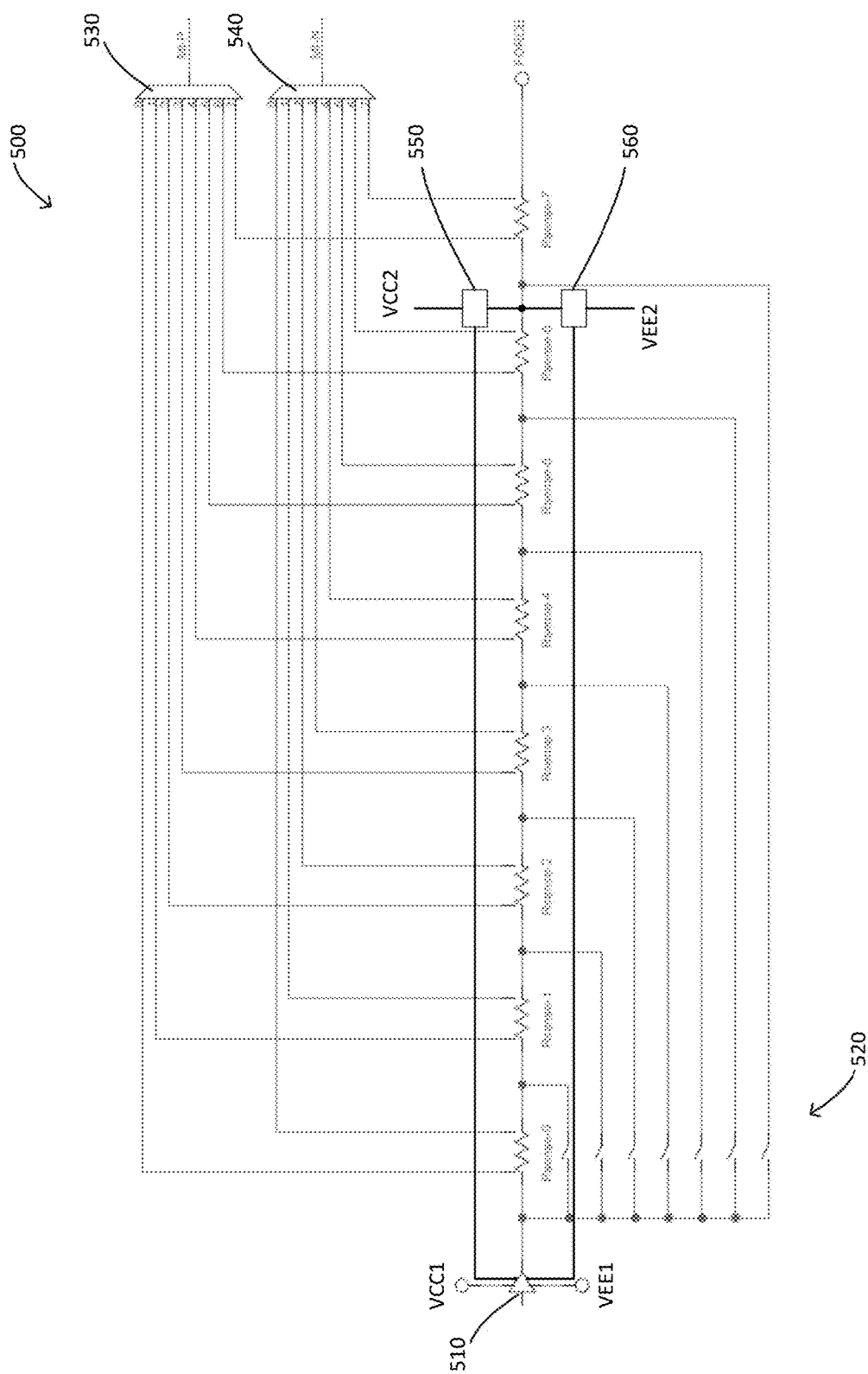
FIG. 8 is a schematic block diagram of a force/sense circuit.

FIG. 8 is a schematic block diagram of a force/sense circuit 500. Force/sense circuit 500 may be used instead of force/sense circuit 100 of FIG. 2, for example, in DPS 30 or PMU 50.

Force/sense circuit 500 includes analog buffer 510, switches 520, sense resistors Rsense-0-Rsense-7, first and second multiplexers 530 and 540, and current injector circuits 550 and 560. Force/sense circuit 500 receives an analog voltage, and generates a force voltage at node FORCE. The force voltage may be provided, for example, to DUT 20. Force/sense circuit 500 also generates a differential signal across MI-P and MI-N corresponding with the amount of current provided to or sunk from DUT 20.

Analog buffer 510 may be similar to analog buffer 110, discussed above.

Sense resistors Rsense-0-Rsense-7 of this embodiment have similar characteristics of Rsense-0-Rsense-7 of force/sense circuit 100 shown in FIG. 2.

Switches 520 are used to selectively shunt sense resistors Rsense-0-Rsense-6. Which of the sense resistors are shunted is determined by control signals controlling switches 520, which have similar characteristics of switches 220 of force/sense circuit 200 of FIG. 3.

First and second multiplexers 530 and 540 are used to select which of the sense resistors is used to generate the differential signal corresponding with the current provided to or sunk from DUT 20, and have similar characteristics of multiplexers 230 and 240 of force/sense circuit 200 of FIG. 3.

Current injector circuit 550, when used, sources current to DUT 20 through sense resistor Rsense-7. The amount of current sourced is based on a signal from analog buffer 510. In some embodiments, current injector circuit 550 is configured to source current to DUT, where the current sourced is about 1, 2, 5, 10, 50, or 100 times the current of sense resistor Rsense-6.

Current injector circuit 560, when used, sinks current from DUT 20 through sense resistor Rsense-7. The amount of current sunk is based on a signal from analog buffer 510. In some embodiments, current injector circuit 560 is configured to sink current from DUT, where the current sunk is about 1, 2, 5, 10, 50, or 100 times the current of sense resistor Rsense-6.

Current injector circuit 550 is configured to source current to DUT 20 through sense resistor Rsense-7 from power supply VCC2. In addition, current injector circuit 560 is configured to sink current from DUT 20 through sense resistor Rsense-7 to power supply VEE2.

In this embodiment, when current injector circuit 550 is used, some current provided to DUT 20 by force/sense circuit 500 is provided by power supply VCC1, and some current provided to DUT 20 by force/sense circuit 500 is provided by power supply VCC2. Because less power is used to source current from VCC2 than from VCC1, use of the current injector circuit 550 reduces power consumption of force/sense circuit 500.

Likewise, when current injector circuit 560 is used, some current sunk from DUT 20 by force/sense circuit 500 is sunk by power supply VEE1, and some current sunk from DUT 20 by force/sense circuit 500 is sunk by power supply VEE2. Because less power is used to sink current to VEE2 than to VEE1, use of the current injector circuit 560 reduces power consumption of force/sense circuit 500.

In addition, because current injector circuits 550 and 560 source or sink some of the current to or from DUT 20, less current is conducted through Rsense-6. Consequently, the voltage drop across Rsense-6 is correspondingly reduced. As a result, force/sense circuit 500 has an output voltage range, which is correspondingly increased.

In some embodiments, VCC1 is equal to VCC2 and VEE1 is equal to VEE2. In such embodiments, use of the current injector circuits 550 and 560 does not result in reduced our consumption. However, in such embodiments, use of the current injector circuits 550 and 560 does result in improved output voltage range.

The control signals for the switches 520 and for the first and second multiplexers 530 and 540 are generated by a processor, such as controller 70 (not shown in this embodiment), which determines which current range the force/sense circuit 500 is to sense. The processor also determines whether to turn on the current injector circuits 550 and 560, and provides an appropriate control signal to the current injector circuits 550 and 560. The processor may determine to turn on at least one of the current injector circuits 550 and 560 in response to the voltage to be supplied to DUT 20 being within a specified voltage range. In some embodiments, the processor is configured to turn on at least one of the current injector circuits 550 and 560 in response to the voltage to be supplied to DUT 20 being within a specified voltage range and the magnitude of the current being supplied to or sunk from DUT 20 being greater than a threshold.

Figure 9:
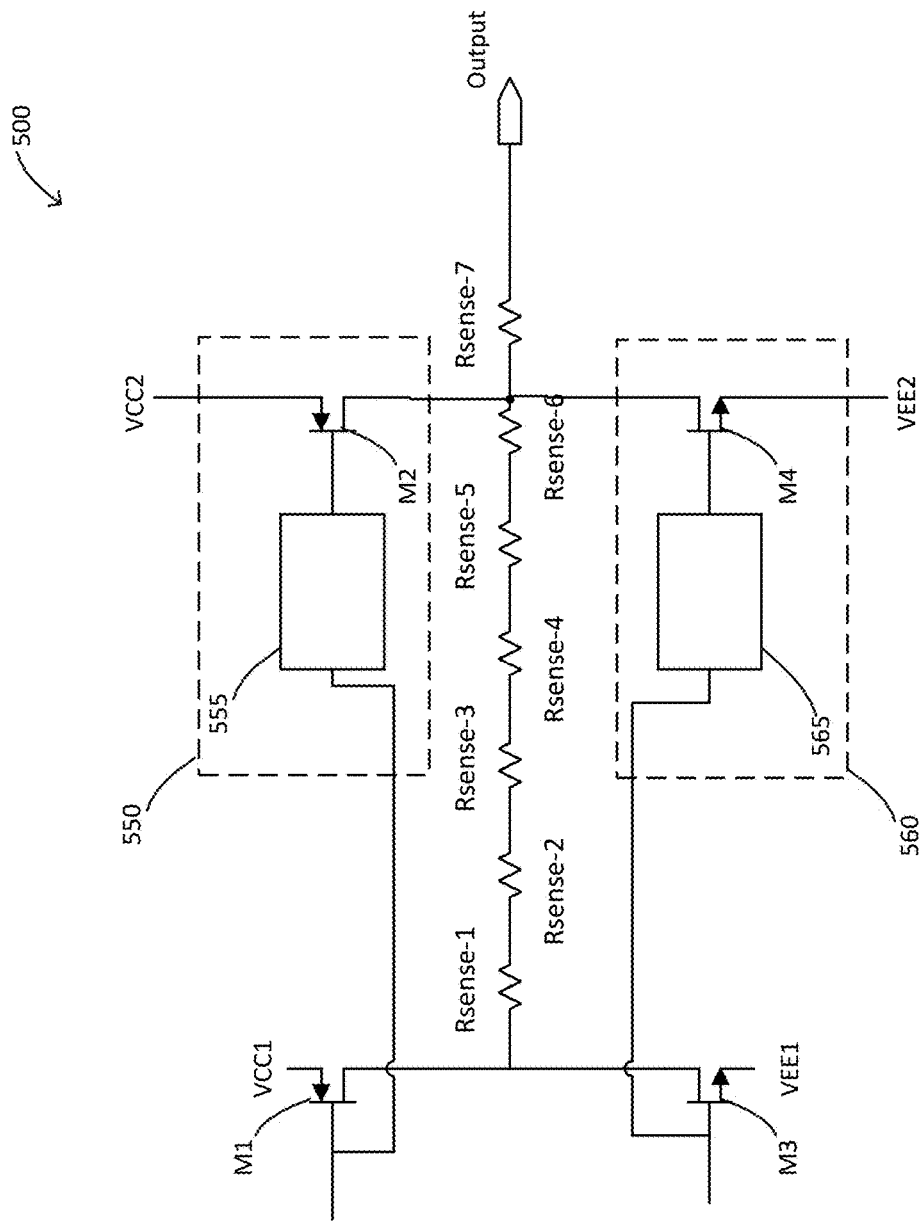
FIG. 9 is a schematic illustration of a portion of an embodiment of force/sense circuit.

FIG. 9 is a schematic illustration of a portion of an embodiment of force/sense circuit 500. In this embodiment, an exemplary output stage of analog buffer 510 is illustrated and includes common source transistors M1 and M3. In addition, embodiments of current injector circuits 550 and 560 are also illustrated. 1

Current injector circuit 550 is illustrated as comprising current source transistor M2 and level shift circuit 555, and embodiment of which is discussed below. In this embodiment, level shift circuit 555 receives from analog buffer 510 a signal, which is the gate voltage of transistor M1. Level shift circuit 555 outputs a voltage to the gate of current source transistor M2 based on the received signal. As a result of the voltage at its gate, current source transistor M2 sources current to DUT 20 through sense resistor Rsense-7.

In some embodiments, a P channel enable transistor (not shown) is used to selectively connect the drain of current source transistor M2 to power supply VCC2, similar to enable transistor's discussed elsewhere herein. The P channel transistor may be controlled by a processor, such as controller 70 (not shown in this embodiment), to selectively enable current injector circuit 550.

In some embodiments, level shift circuit 555 receives one or more offset adjust signals, which control an output offset voltage of level shift circuit 555, for example, as discussed elsewhere herein.

Current injector circuit 560 is illustrated as comprising current sink transistor M4 and level shift circuit 565, an embodiment of which is discussed below. In this embodiment, level shift circuit 565 receives from analog buffer 510 a signal, which is the gate voltage of transistor M3. Level shift circuit 565 outputs a voltage to the gate of current sink transistor M4 based on the received signal. As a result of the voltage at its gate, current sink transistor M4 sinks current from DUT 20 through sense resistor Rsense-7.

In some embodiments, an N channel enable transistor (not shown) is used to selectively connect the drain of current sink transistor M4 to power supply VEE2, similar to enable transistor's discussed elsewhere herein. The N channel transistor may be controlled by a processor, such as controller 70 (not shown in this embodiment), to selectively enable current injector circuit 560.

In some embodiments, level shift circuit 565 receives one or more offset adjust signals, which control an output offset voltage of level shift circuit 565, for example, as discussed elsewhere herein.

Figure 10:
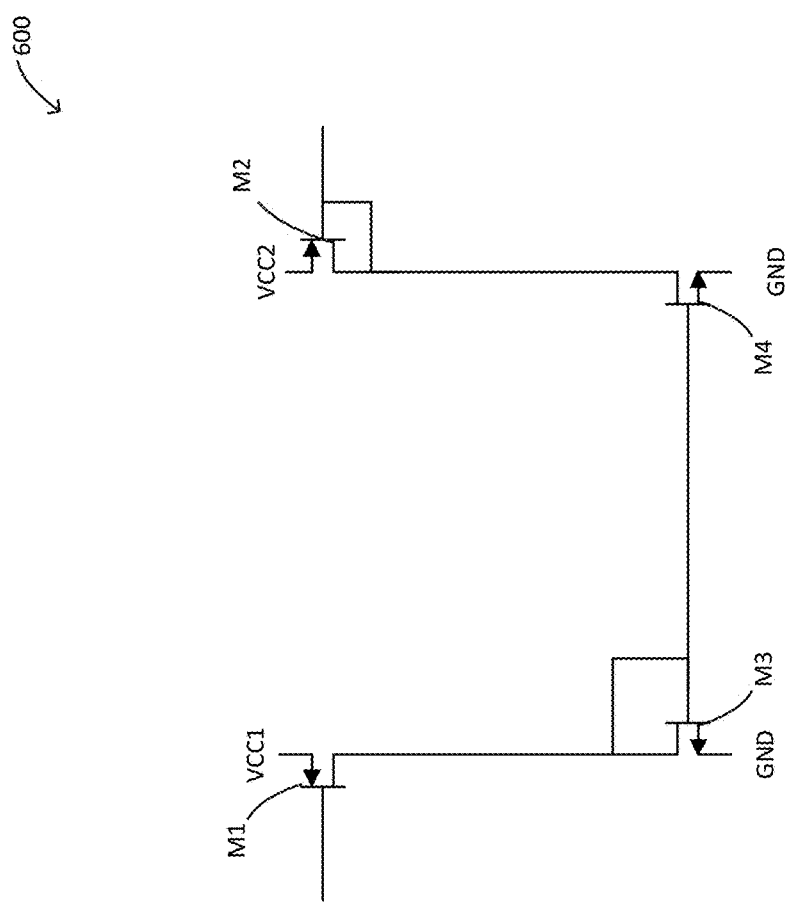
FIG. 10 is an illustration of a level shift circuit.

FIG. 10 is an illustration of a level shift circuit 600 which may be used in embodiments of level shift circuit 555 of the embodiment of FIG. 9. Level shift circuit 600 transistors M1, M2, M3, and M4.

In this embodiment, transistors M1, M2, M3, and M4 are configured as simple current mirrors. As is known by those skilled in the art, sizes of transistors M1, M2, M3, and M4 may be determined so as to generate an output voltage which causes current source transistor M2 of FIG. 9 to source an amount of current which is a desired multiple of the current of transistor M1 of FIG. 9. As indicated in FIG. 10, level shift circuit 600 receives an input voltage referenced from power supply VCC1, and level shifts the input voltage to generate an output voltage referenced from power supply VCC2.

In some embodiments, offset adjust current sources (not shown) are additionally included in level shift circuit 600. For example, a first offset adjust current source may be configured to source current to the drain of transistor M3, and a second offset adjust current source may be configured to sink current from the drain of transistor M3. Each of the first and second offset adjust current sources may receive a control voltage, which controls the magnitude of the current sourced or sunk thereby.

Figure 11:
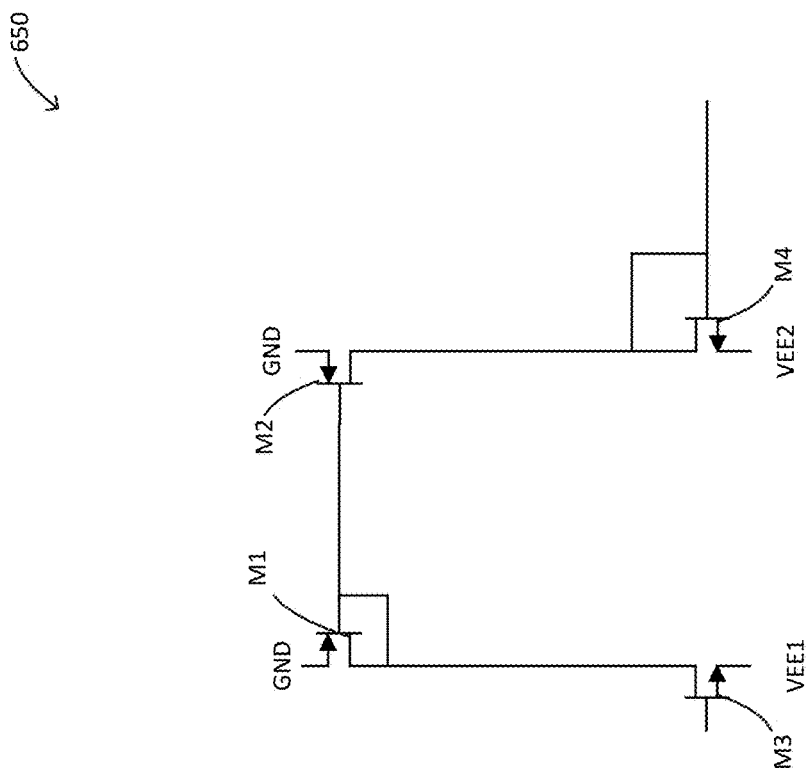
FIG. 11 is an illustration of a level shift circuit.

In other embodiments, other current mirroring architectures are used. In some embodiments, other level shifting architectures are used FIG. 11 is an illustration of a level shift circuit 650 which may be used in embodiments of level shift circuit 565 of the embodiment of FIG. 9. Level shift circuit 650 transistors M1, M2, M3, and M4.

In this embodiment, transistors M1, M2, M3, and M4 are configured as simple current mirrors. As is known by those skilled in the art, sizes of transistors M1, M2, M3, and M4 may be determined so as to generate an output voltage which causes current source transistor M4 of FIG. 9 to sink an amount of current which is a desired multiple of the current of transistor M3 of FIG. 9. As indicated in FIG. 11, level shift circuit 650 receives an input voltage referenced from power supply VEE1, and level shifts the input voltage to generate an output voltage referenced from power supply VEE2.

In some embodiments, offset adjust current sources (not shown) are additionally included in level shift circuit 650. For example, a first offset adjust current source may be configured to sink current from the drain of transistor M1, and a second offset adjust current source may be configured to source current to the drain of transistor M1. Each of the first and second offset adjust current sources may receive a control voltage, which controls the magnitude of the current sourced or sunk thereby.

Figure 12:
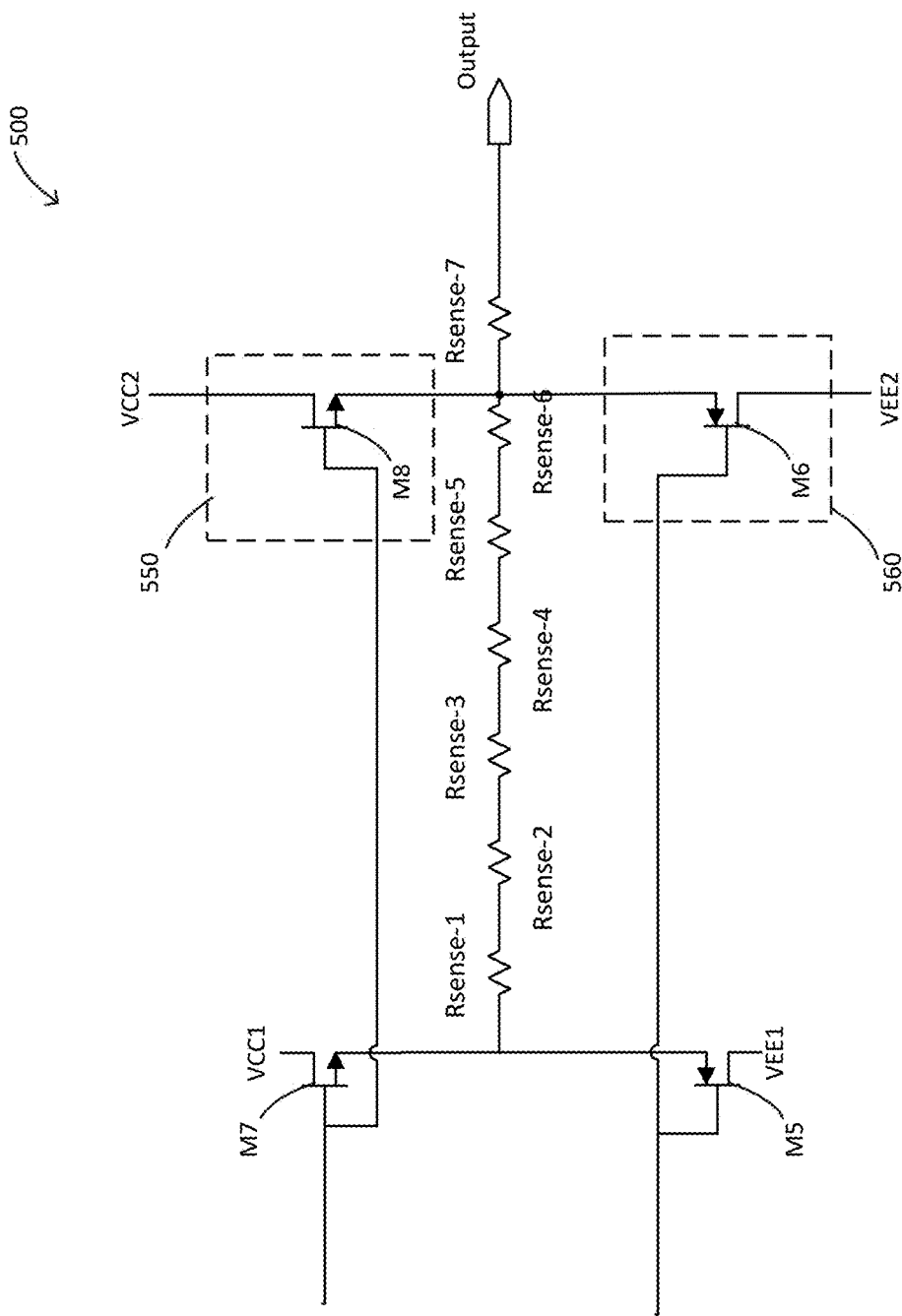
FIG. 12 is a schematic illustration of a portion of an embodiment of force/sense circuit.

In other embodiments, other current mirroring architectures are used. In some embodiments, other level shifting architectures are used FIG. 12 is a schematic illustration of a portion of an embodiment of force/sense circuit 500. In this embodiment, an exemplary output stage of analog buffer 510 is illustrated and includes source follower transistors M7 and M5. In addition, embodiments of current injector circuits 550 and 560 are also illustrated.

Current injector circuit 550 is illustrated as comprising source follower transistor M8. In this embodiment, source follower transistor M8 receives from analog buffer 510 a signal, which is the gate voltage of transistor M7. As a result of the voltage at its gate, source follower transistor M8 sources current to DUT 20 through sense resistor Rsense-7. The magnitude of the current sourced by source follower transistor M8 is substantially determined by the relative sizes of source follower transistors M7 and M8. In some embodiments, the magnitude of the current sourced by source follower transistor M8 is about 1, 2, 5, 10, 50, or 100 times the current of transistor M7.

Current injector circuit 560 is illustrated as comprising source follower transistor M6. In this embodiment, source follower transistor M6 receives from analog buffer 510 a signal, which is the gate voltage of transistor M5. As a result of the voltage at its gate, source follower transistor M6 sinks current from DUT 20 through sense resistor Rsense-7. The magnitude of the current sunk by source follower transistor M6 is substantially determined by the relative sizes of source follower transistors M5 and M6. In some embodiments, the magnitude of the current sunk by source follower transistor M6 is about 1, 2, 5, 10, 50, or 100 times the current of transistor M5.

In some embodiments, a P channel enable transistor (not shown) is used to selectively connect the drain of source follower transistor M8 to power supply VCC2, similar to enable transistor's discussed elsewhere herein. The P channel transistor may be controlled by a processor, such as controller 70 (not shown in this embodiment), to selectively enable current injector circuit 550.

In some embodiments, an N channel enable transistor (not shown) is used to selectively connect the drain of source follower transistor M6 to power supply VEE2, similar to enable transistor's discussed elsewhere herein. The N channel transistor may be controlled by a processor, such as controller 70 (not shown in this embodiment), to selectively enable current injector circuit 560.

Figure 13:
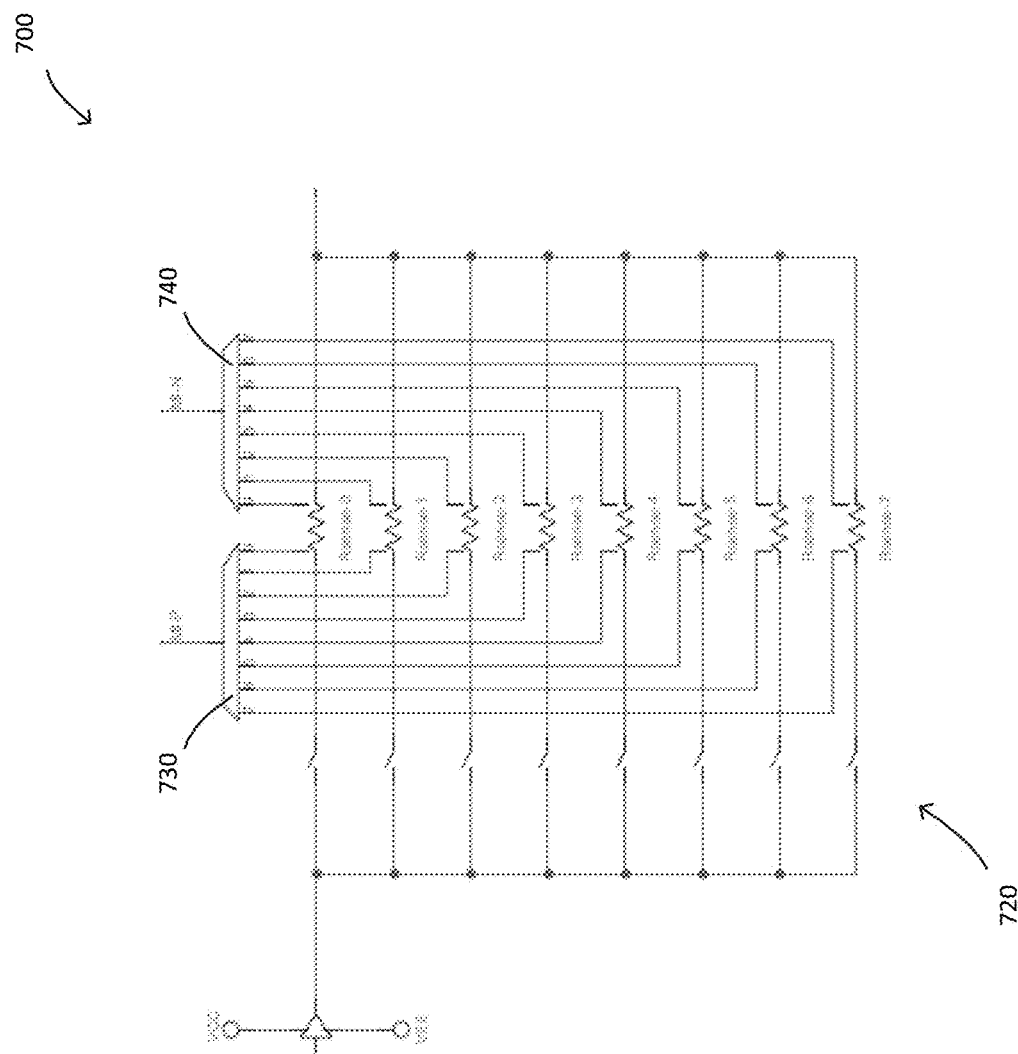
FIG. 13 is a schematic diagram of a force/sense circuit.

FIG. 13 is a schematic diagram of a force/sense circuit 700. Force/sense circuit 700 may, for example, be part of DPS 30 or PMU 50. In some embodiments, force/sense circuit 100 is included, for example, in a feedback loop circuit configured to provide an amount of current to a DUT which induces a desired voltage at the DUT, and to provide a voltage signal corresponding to the amount of current required to induce the desired voltage at the DUT, where the feedback loop receives the desired voltage at an input.

Force/sense circuit 700 includes analog buffer 710, switches 720, sense resistors Rsense-0-Rsense-7, and first and second multiplexers 730 and 740. Force/sense circuit 700 receives an analog voltage, and generates a force voltage at node FORCE. The force voltage may be provided, for example, to DUT 20. Force/sense circuit 700 also generates a differential signal across MI-P and MI-N corresponding with the amount of current provided to or sunk from DUT 20.

Analog buffer 710 may have features similar to analog buffer 110 of FIG. 2. Other configurations may alternatively be used.

Sense resistors Rsense-0-Rsense-7 are connected in parallel, and are used to generate the differential signal corresponding with the amount of current provided to or sunk from DUT 20. Sense resistors Rsense-0-Rsense-7 have progressively smaller resistance values. For example, Rsense-0 may have 10 times the resistance value of Rsense-1, 100 times the resistance value of Rsense-2, and so forth.

Switches 720 are used to selectively connect sense resistors Rsense-0-Rsense-7 to analog buffer 710. Which of the sense resistors are connected is determined by control signals controlling switches 720. The control signals are used to set a sensing range. For example, if force/sense circuit 700 applies a maximum current, sense resistors Rsense-7 is connected to analog buffer 710, and the maximum current flows through only Rsense-7 of the sense resistors. Alternatively, if force/sense circuit 700 applies a minimum current, sense resistors Rsense-0 is connected to analog buffer 710, and the minimum current flows through only Rsense-0 of the sense resistors.

First and second multiplexers 730 and 740 are used to select which of the sense resistors is used to generate the differential signal corresponding with the current provided to or sunk from DUT 20. For example, in this embodiment, the sense resistor selected is the sense resistor which is connected to analog buffer 710. The first and second multiplexers 730 and 740 are driven with control signals which communicate the appropriate selection to be made.

The control signals for the switches 720 and for the first and second multiplexers 730 and 740 are generated by a processor, such as controller 70 (not shown in this embodiment), which determines which current range the force/sense circuit 700 is to sense.

In this embodiment, all current provided to or sunk from DUT 20 by force/sense circuit 700 is provided by power supply VCC or is sunk by power supply VEE.

Figure 14:
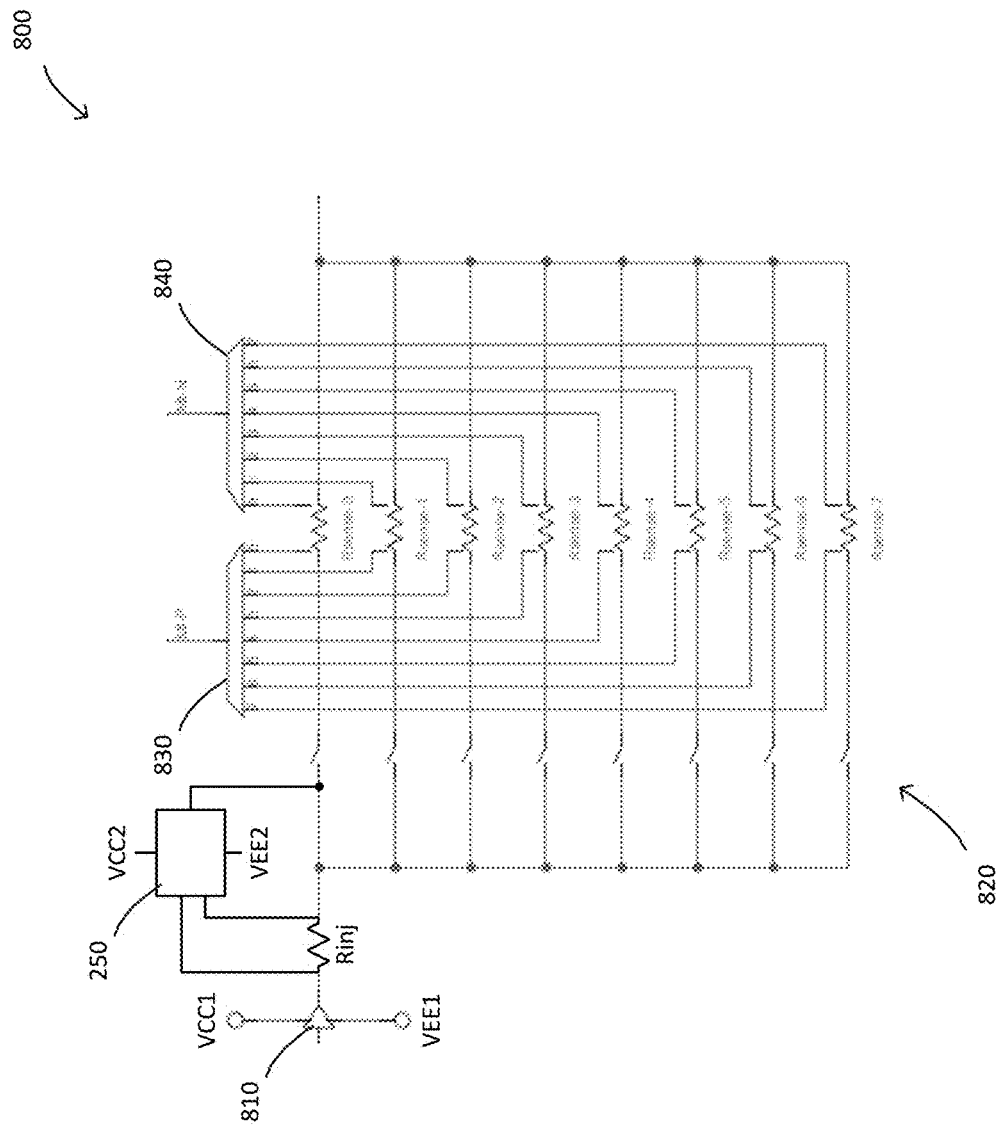
FIG. 14 is a schematic block diagram of a force/sense circuit.

FIG. 14 is a schematic block diagram of a force/sense circuit 800. Force/sense circuit 800 may be used instead of force/sense circuit 700 of FIG. 13, for example, in DPS 30 or PMU 50.

Force/sense circuit 800 includes analog buffer 810, switches 820, sense resistors Rsense-0-Rsense-7, first and second multiplexers 830 and 840, injector sense resistor Rinj, and current injector circuit 250. Force/sense circuit 800 receives an analog voltage, and generates a force voltage at node FORCE. The force voltage may be provided, for example, to DUT 20. Force/sense circuit 800 also generates a differential signal across MI-P and MI-N corresponding with the amount of current provided to or sunk from DUT 20.

Analog buffer 810 may be similar to analog buffer 710, discussed above.

Sense resistors Rsense-0-Rsense-6 of this embodiment have similar characteristics of Rsense-0-Rsense-7 of force/sense circuit 700 shown in FIG. 13.

Switches 820 are used to selectively connect sense resistors Rsense-0-Rsense-7 to analog buffer 810. Which of the sense resistors are connected is determined by control signals controlling switches 820. The control signals are used to set a sensing range. For example, if force/sense circuit 800 applies a maximum current, sense resistors Rsense-7 is connected to analog buffer 810, and the maximum current flows through only Rsense-7 of the sense resistors. Alternatively, if force/sense circuit 800 applies a minimum current, sense resistors Rsense-0 is connected to analog buffer 810, and the minimum current flows through only Rsense-0 of the sense resistors.

First and second multiplexers 830 and 840 are used to select which of the sense resistors is used to generate the differential signal corresponding with the current provided to or sunk from DUT 20. For example, in this embodiment, the sense resistor selected is the sense resistor which is connected to analog buffer 810. The first and second multiplexers 830 and 840 are driven with control signals which communicate the appropriate selection to be made.

Current injector circuit 250 sources current to or sinks current from DUT 20 through the selected sense resistor. The amount of current sourced or sunk is based on the voltage difference across injector sense resistor Rinj, which corresponds with the current from or to analog buffer 810. In some embodiments, the resistance of injector sense resistor Rinj is about 1, 2, 5, 10, 50, or 100 time the resistance of sense resistor Rsense-7. In some embodiments, current injector circuit 250 is configured to source or sink current to or from DUT, where the current sourced or sunk is about 1, 2, 5, 10, 50, or 100 times the current of injector sense resistor Rinj.

In this embodiment, when current injector circuit 250 is used, some current provided to or sunk from DUT 20 by force/sense circuit 800 is provided by power supply VCC1 or is sunk by power supply VEE1, and some current provided to or sunk from DUT 20 by force/sense circuit 800 is provided by power supply VCC2 or is sunk by power supply VEE2. Because the voltage of VCC1 is greater than the voltage of VCC2, less power is used to source current from VCC2 than from VCC1. Similarly, because the magnitude of the voltage of VEE1 is greater than the magnitude of the voltage of VEE2, less power is used to sink current to VEE2 than to VEE1. As a result, use of the current injector circuit 250 reduces power consumption of force/sense circuit 200.

In addition, because current injector circuit 250 sources or sinks some of the current to or from DUT 20, less current is conducted through injector sense resistor Rinj. Consequently, the voltage drop across resistor Rinj is correspondingly reduced. As a result, force/sense circuit 800 has an output voltage range, which is correspondingly increased.

In some embodiments, VCC1 is equal to VCC2 and VEE1 is equal to VEE2. In such embodiments, use of the current injector circuit 250 does not result in reduced our consumption. However, in such embodiments, use of the current injector circuit 250 does result in improved output voltage range.

The control signals for the switches 820 and for the first and second multiplexers 830 and 840 are generated by a processor, such as controller 70 (not shown in this embodiment), which determines which current range the force/sense circuit 800 is to sense. The processor also determines whether to turn on the current injector circuit 250, and provides an appropriate control signal to the current injector circuit 250. The processor may determine to turn on the current injector circuit 250 in response to the voltage to be supplied to DUT 20 being within a specified voltage range. In some embodiments, the processor is configured to turn on the current injector circuit 250 in response to the voltage to be supplied to DUT 20 being within a specified voltage range and the magnitude of the current being supplied to or sunk from DUT 20 being greater than a threshold.

In some embodiments, additional switches (not show) are included. The additional switches, are selectively controlled by the processor to cause sense resistor Rsense-6 or another sense resistor to be configured to function as the injector sense resistor Rinj. In such embodiments the injector sense resistor Rinj is omitted.

Figure 15:
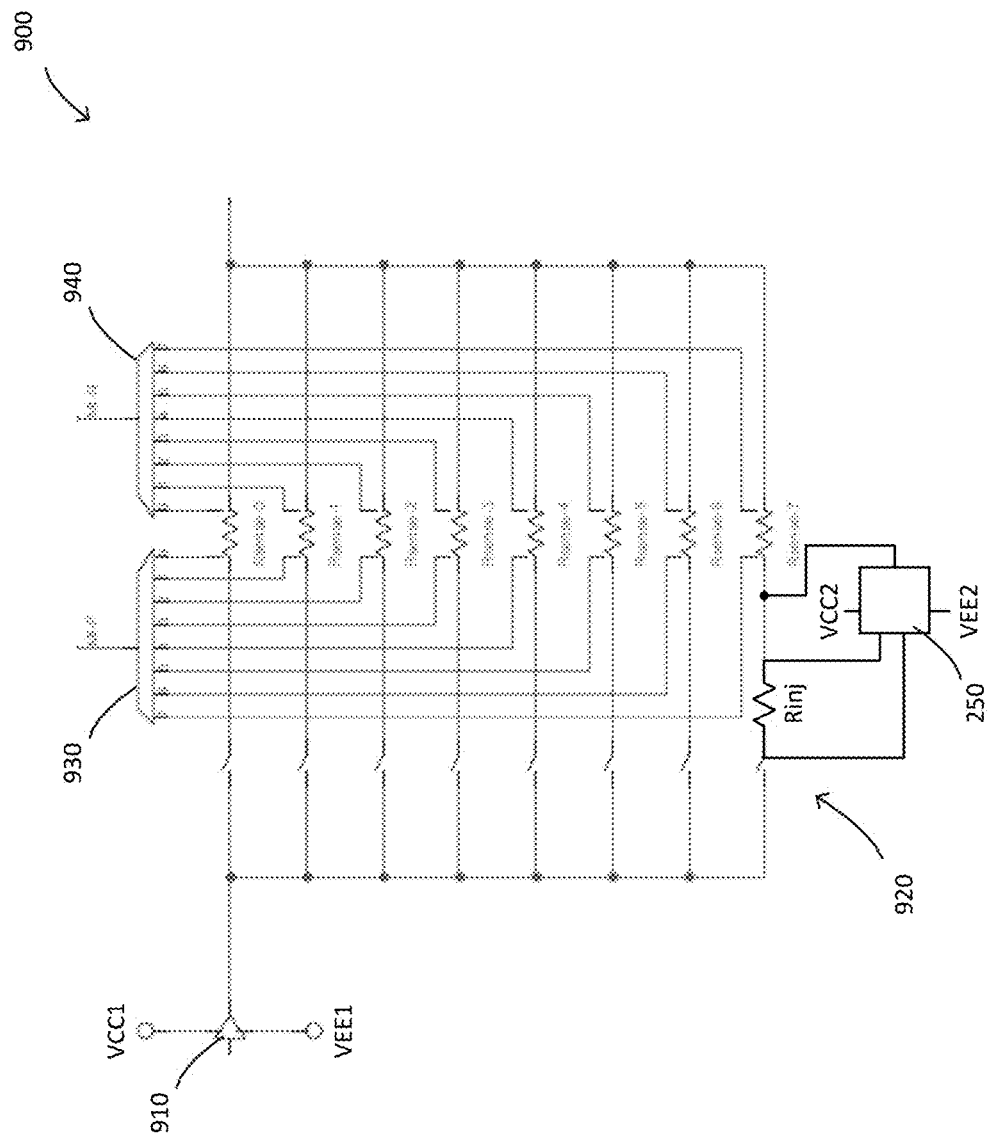
FIG. 15 is a schematic block diagram of a force/sense circuit.

FIG. 15 is a schematic block diagram of a force/sense circuit 900. Force/sense circuit 900 may be used instead of force/sense circuit 700 of FIG. 13, for example, in DPS 30 or PMU 50.

Force/sense circuit 900 includes analog buffer 910, switches 920, sense resistors Rsense-0-Rsense-7, first and second multiplexers 930 and 940, injector sense resistor Rinj, and current injector circuit 250. Force/sense circuit 900 receives an analog voltage, and generates a force voltage at node FORCE. The force voltage may be provided, for example, to DUT 20. Force/sense circuit 900 also generates a differential signal across MI-P and MI-N corresponding with the amount of current provided to or sunk from DUT 20.

Analog buffer 910 may be similar to analog buffer 710, discussed above.

Sense resistors Rsense-0-Rsense-6 of this embodiment have similar characteristics of Rsense-0-Rsense-7 of force/sense circuit 700 shown in FIG. 13. Switches 920 have similar characteristics as switches 820 of FIG. 14. First and second multiplexers 930 and 940 have similar characteristics as multiplexors 830 and 840 of FIG. 14. Current injector circuit 250 has similar characteristics as that of FIG. 14.

In this embodiment, when sense resistor Rsense-7 is used, some current provided to or sunk from DUT 20 by force/sense circuit 900 is provided by power supply VCC1 or is sunk by power supply VEE1, and some current provided to or sunk from DUT 20 by force/sense circuit 900 is provided by power supply VCC2 or is sunk by power supply VEE2. Because the voltage of VCC1 is greater than the voltage of VCC2, less power is used to source current from VCC2 than from VCC1. Similarly, because the magnitude of the voltage of VEE1 is greater than the magnitude of the voltage of VEE2, less power is used to sink current to VEE2 than to VEE1. As a result, use of the current injector circuit 250 reduces power consumption of force/sense circuit 200.

In addition, because current injector circuit 250 sources or sinks some of the current to or from DUT 20, less current is conducted through injector sense resistor Rinj. Consequently, the voltage drop across resistor Rinj is correspondingly reduced. As a result, force/sense circuit 900 has an output voltage range, which is correspondingly increased.

The control signals for the switches 920 and for the first and second multiplexers 930 and 940 are generated by a processor, such as controller 70 (not shown in this embodiment), which determines which current range the force/sense circuit 900 is to sense. The processor also determines whether to turn on the current injector circuit 250, and provides an appropriate control signal to the current injector circuit 250. The processor may determine to turn on the current injector circuit 250 in response to the voltage to be supplied to DUT 20 being within a specified voltage range.

In some embodiments, the processor is configured to turn on the current injector circuit 250 in response to the voltage to be supplied to DUT 20 being within a specified voltage range and the magnitude of the current being supplied to or sunk from DUT 20 being greater than a threshold.

Current injector circuits, having characteristics of the circuits discussed with reference to FIGS. 4, 5, 6, and 7 may be used in the current injector circuit 250 of FIGS. 14 and 15.

In some embodiments, additional switches (not show) are included. The additional switches, are selectively controlled by the processor to cause sense resistor Rsense-6 or another sense resistor to be configured to function as the injector sense resistor Rinj. In such embodiments the injector sense resistor Rinj is omitted.

Figure 16:
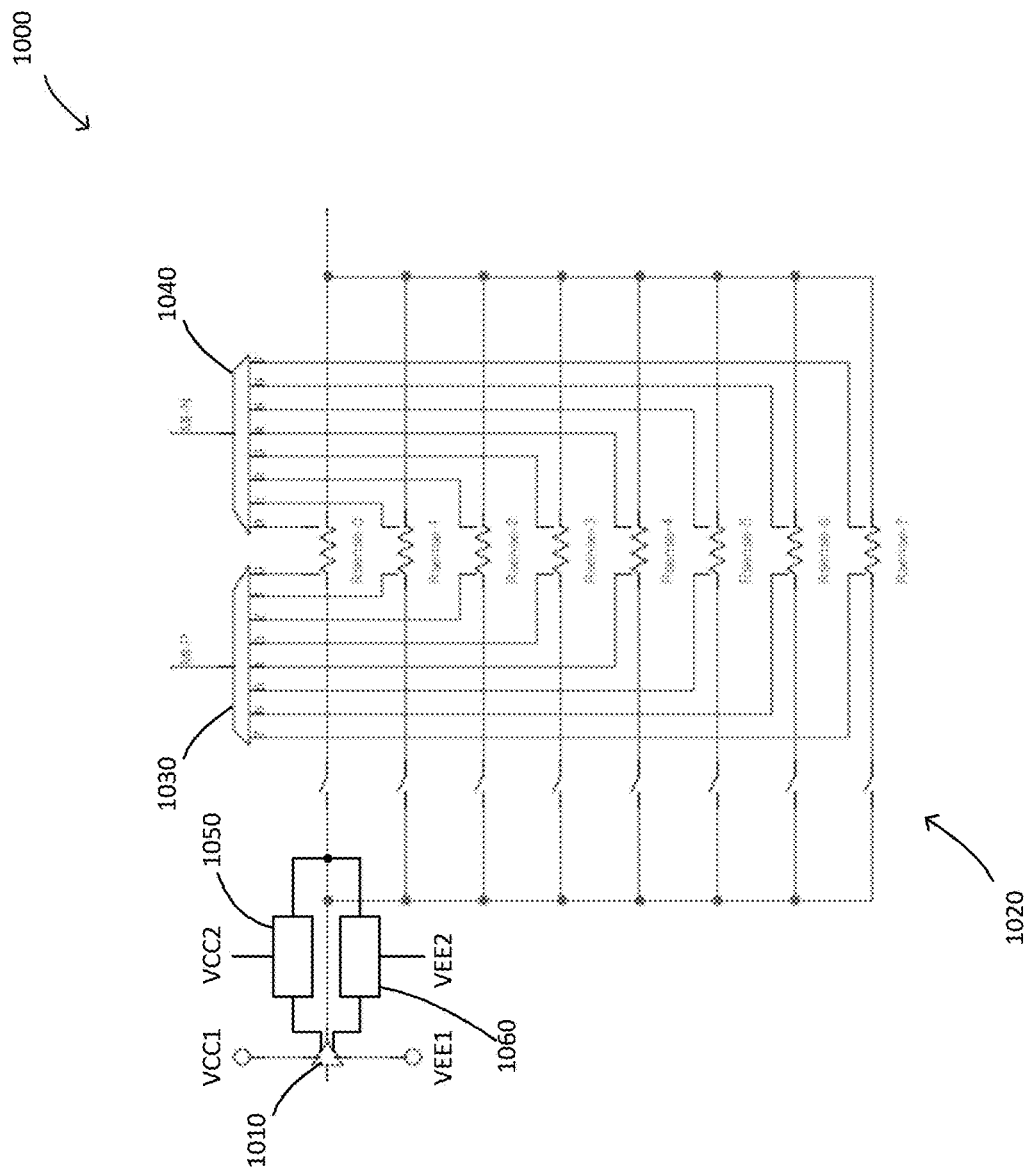
FIG. 16 is a schematic block diagram of a force/sense circuit.

FIG. 16 is a schematic block diagram of a force/sense circuit 1000. Force/sense circuit 1000 may be used instead of force/sense circuit 100 of FIG. 2, for example, in DPS 30 or PMU 50.

Force/sense circuit 1000 includes analog buffer 1010, switches 1020, sense resistors Rsense-0-Rsense-7, first and second multiplexers 1030 and 1040, and current injector circuits 1050 and 1060. Force/sense circuit 1000 receives an analog voltage, and generates a force voltage at node FORCE. The force voltage may be provided, for example, to DUT 20. Force/sense circuit 1000 also generates a differential signal across MI-P and MI-N corresponding with the amount of current provided to or sunk from DUT 20.

Analog buffer 1010 may be similar to analog buffer 710, discussed above.

Sense resistors Rsense-0-Rsense-6 of this embodiment have similar characteristics of Rsense-0-Rsense-7 of force/sense circuit 700 shown in FIG. 13. Switches 1020 have similar characteristics as switches 820 of FIG. 14. First and second multiplexers 1030 and 1040 have similar characteristics as multiplexors 830 and 840 of FIG. 14. Current injector circuits 1050 and 1060 have similar characteristics as those of current injector circuits 550 and 650 of FIG. 8.

Current injector circuit 1050, when used, sources current to DUT 20 through the selected sense resistor. The amount of current sourced is based on a signal from analog buffer 1010. In some embodiments, current injector circuit 1050 is configured to source current to DUT 20, where the current sourced is about 1, 2, 5, 10, 50, or 100 times the current sourced to the DUT 20 by analog buffer 1010.

Current injector circuit 1060, when used, sinks current from DUT 20 through the selected sense resistor. The amount of current sunk is based on a signal from analog buffer 1010. In some embodiments, current injector circuit 1050 is configured to sink current from DUT 20, where the current sunk is about 1, 2, 5, 10, 50, or 100 times the current sunk from the DUT 20 by analog buffer 1010.

Current injector circuit 1050 is configured to source current to DUT 20 through the selected sense resistor from power supply VCC2. In addition, current injector circuit 1060 is configured to sink current from DUT 20 through the selected sense resistor to power supply VEE2.

In this embodiment, when current injector circuit 1050 is used, some current provided to DUT 20 by force/sense circuit 1000 is provided by power supply VCC1, and some current provided to DUT 20 by force/sense circuit 1000 is provided by power supply VCC2. Because less power is used to source current from VCC2 than from VCC1, use of the current injector circuit 1050 reduces power consumption of force/sense circuit 1000.

Likewise, when current injector circuit 1060 is used, some current sunk from DUT 20 by force/sense circuit 1000 is sunk by power supply VEE1, and some current sunk from DUT 20 by force/sense circuit 1000 is sunk by power supply VEE2. Because less power is used to sink current to VEE2 than to VEE1, use of the current injector circuit 1060 reduces power consumption of force/sense circuit 1000.

In some embodiments, VCC1 is equal to VCC2 and VEE1 is equal to VEE2.

The control signals for the switches 1020 and for the first and second multiplexers 1030 and 1040 are generated by a processor, such as controller 70 (not shown in this embodiment), which determines which current range the force/sense circuit 1000 is to sense. The processor also determines whether to turn on the current injector circuits 1050 and 1060, and provides an appropriate control signal to the current injector circuits 1050 and 1060. The processor may determine to turn on at least one of the current injector circuits 1050 and 1060 in response to the voltage to be supplied to DUT 20 being within a specified voltage range. In some embodiments, the processor is configured to turn on at least one of the current injector circuits 1050 and 1060 in response to the voltage to be supplied to DUT 20 being within a specified voltage range and the magnitude of the current being supplied to or sunk from DUT 20 being greater than a threshold.

Figure 17:
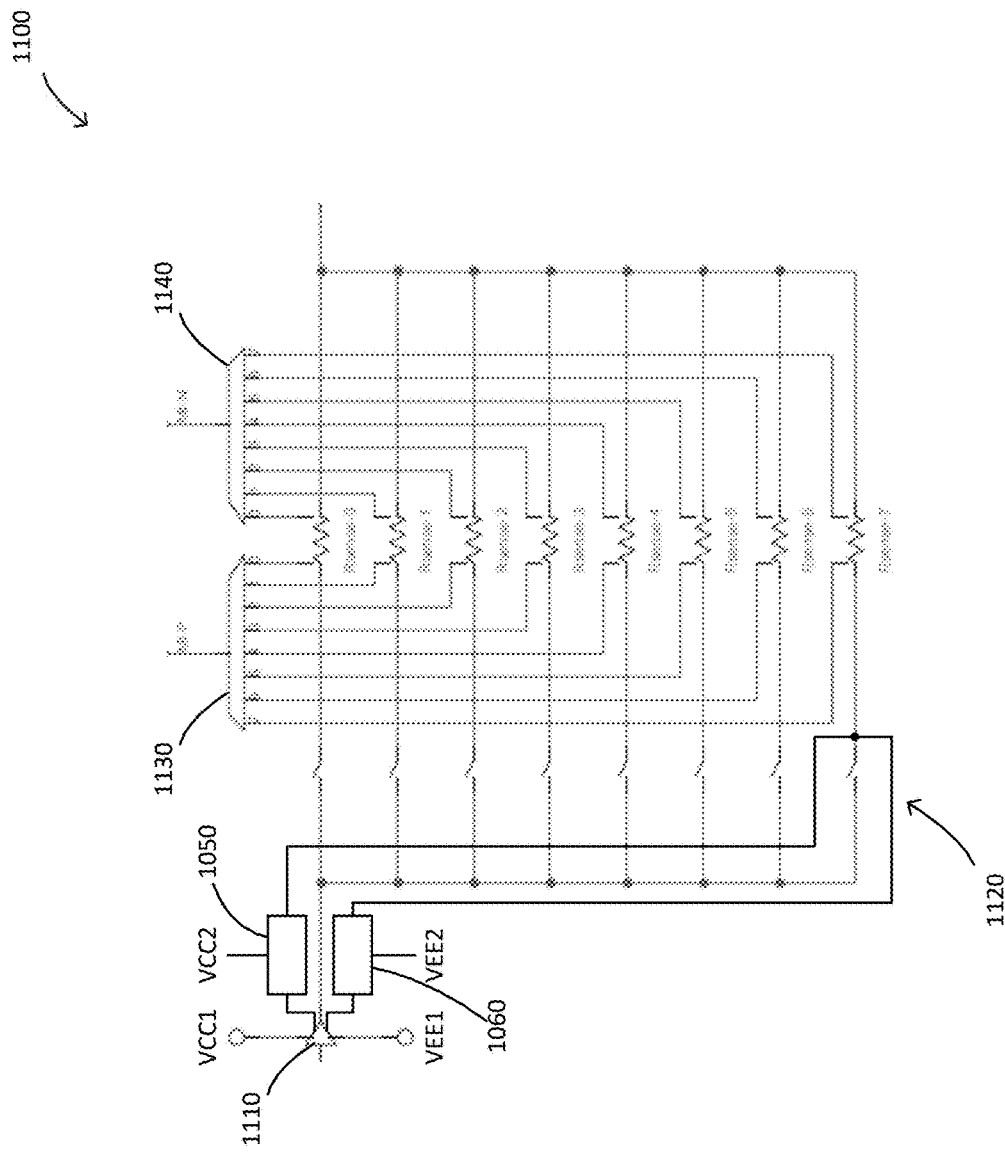
FIG. 17 is a schematic block diagram of a force/sense circuit.

FIG. 17 is a schematic block diagram of a force/sense circuit 1100. Force/sense circuit 1100 may be used instead of force/sense circuit 100 of FIG. 2, for example, in DPS 30 or PMU 50.

Force/sense circuit 1100 includes analog buffer 1110, switches 1120, sense resistors Rsense-0-Rsense-7, first and second multiplexers 1130 and 1140, and current injector circuits 1050 and 1060. Force/sense circuit 1100 receives an analog voltage, and generates a force voltage at node FORCE. The force voltage may be provided, for example, to DUT 20. Force/sense circuit 1100 also generates a differential signal across MI-P and MI-N corresponding with the amount of current provided to or sunk from DUT 20.

Analog buffer 1110 may be similar to analog buffer 710, discussed above. Sense resistors Rsense-0-Rsense-6 of this embodiment have similar characteristics of Rsense-0-Rsense-7 of force/sense circuit 700 shown in FIG. 13. Switches 1020 have similar characteristics as switches 820 of FIG. 14. First and second multiplexers 1030 and 1040 have similar characteristics as multiplexors 830 and 840 of FIG. 14. Current injector circuits 1050 and 1060 have similar characteristics as those of current injector circuits 550 and 650 of FIG. 8.

Current injector circuit 1050, when used, sources current to DUT 20 through the sense resistor Rsense-7. The amount of current sourced is based on a signal from analog buffer 1110. In some embodiments, current injector circuit 1150 is configured to source current to DUT 20, where the current sourced is about 1, 2, 5, 10, 50, or 100 times the current sourced to the DUT 20 by analog buffer 1110.

Current injector circuit 1060, when used, sinks current from DUT 20 through sense resistor Rsense-7. The amount of current sunk is based on a signal from analog buffer 1010. In some embodiments, current injector circuit 1050 is configured to sink current from DUT 20, where the current sunk is about 1, 2, 5, 10, 50, or 100 times the current sunk from the DUT 20 by analog buffer 1010.

Current injector circuit 1050 is configured to source current to DUT 20 through the sense resistor Rsense-7 from power supply VCC2. In addition, current injector circuit 1060 is configured to sink current from DUT 20 through the sense resistor Rsense-7 to power supply VEE2.

In this embodiment, when current injector circuit 1050 is used, some current provided to DUT 20 by force/sense circuit 1100 is provided by power supply VCC1, and some current provided to DUT 20 by force/sense circuit 1100 is provided by power supply VCC2. Because less power is used to source current from VCC2 than from VCC1, use of the current injector circuit 1050 reduces power consumption of force/sense circuit 1000.

Likewise, when current injector circuit 1060 is used, some current sunk from DUT 20 by force/sense circuit 1100 is sunk by power supply VEE1, and some current sunk from DUT 20 by force/sense circuit 1100 is sunk by power supply VEE2. Because less power is used to sink current to VEE2 than to VEE1, use of the current injector circuit 1060 reduces power consumption of force/sense circuit 1100.

In some embodiments, VCC1 is equal to VCC2 and VEE1 is equal to VEE2.

The control signals for the switches 1120 and for the first and second multiplexers 1130 and 1140 are generated by a processor, such as controller 70 (not shown in this embodiment), which determines which current range the force/sense circuit 1100 is to sense. The processor also determines whether to turn on the current injector circuits 1050 and 1060, and provides an appropriate control signal to the current injector circuits 1050 and 1060. The processor may determine to turn on at least one of the current injector circuits 1050 and 1060 in response to the voltage to be supplied to DUT 20 being within a specified voltage range. In some embodiments, the processor is configured to turn on at least one of the current injector circuits 1050 and 1060 in response to the voltage to be supplied to DUT 20 being within a specified voltage range and the magnitude of the current being supplied to or sunk from DUT 20 being greater than a threshold.

Some embodiments include a force circuit, which does not sense current. For example, circuits resulting from removing the switches and sense resistors used only for generating the differential signals from the force/sense circuits discussed herein are contemplated. For example, such a circuit includes an analog buffer, as discussed herein, and a current injector, as discussed herein. Such embodiments may include a sense resistor for the current injector. Such a circuit provides improved power consumption performance for reasons discussed with regard to the other circuits discussed herein.

The methods and actions described above may be performed by a computer system or a programmable device which accesses instructions for performing the methods and actions stored on a computer readable medium, such as a memory or another data storage device. The instructions, when executed by the computer system, cause the methods and actions to be performed. The instructions may be stored in a non-transitory computer readable medium, such as a memory or data storage device. The computer system, configured to perform or to be used to perform the methods and actions described above, accesses the instructions to perform the methods and actions. The instructions may be generated by conventional computer program coding and compiling operations.

The various aspects, processes, actions may be performed sequentially or in parallel. For example, a system capable of parallel processing may divide certain procedures among the available processing devices.

While various aspects, processes, actions, and systems have been described as being included in the embodiments discussed, the various aspects, processes, actions, and systems can be practiced with certain modifications. For example, the sequential order of the various aspects, processes, and actions may be modified. In addition, implementations having aspects of more than one embodiment may be practiced. Furthermore, implementations having certain aspects omitted may be practiced.

The invention claimed is:

1. A force/sense circuit, comprising:
   first and second resistors;
   a driver configured to source driver current through the first and second resistors from a first power supply of a first voltage;
   a current injector configured to source injector current through the second resistor from a second power supply of a second voltage, wherein the magnitude of the first voltage is greater than the magnitude of the second voltage;
   a force output configured to conduct the driver current and the injector current to another circuit when electrically connected to the other circuit; and
   a sense output configured to transmit a signal corresponding with the sum of the driver current and the injector current,
   wherein the driver is further configured to sink driver current through the first and second resistors to a third power supply of a third voltage, wherein the current injector is further configured to sink injector current through the second resistor to a fourth power supply of a fourth voltage, wherein the magnitude of the third voltage is greater than the magnitude of the fourth voltage, and wherein the force output is further configured to conduct the driver current and the injector current from the other circuit when electrically connected to the other circuit.

2. The circuit of claim 1, wherein the current injector is configured to source injector current through the second resistor as a result of the driver current being greater than a threshold.

3. The circuit of claim 1, wherein the transmitted signal corresponds with the voltage across the second resistor.

4. The circuit of claim 1, wherein the force/sense circuit is included in a feedback loop circuit configured to conduct the driver current and the injector current to the other circuit when electrically connected to the other circuit, wherein the driver current and the injector current collectively induce a predetermined voltage at the other circuit.

5. The circuit of claim 4, wherein the feedback loop circuit comprises an input, and is configured to receive a voltage corresponding with the desired voltage at the input.

6. The circuit of claim 1, wherein the current injector is configured to be selectively enabled and disabled.

7. The circuit of claim 6, wherein, when the current injector is disabled, the transmitted signal corresponds with the voltage across the first resistor.

8. The circuit of claim 7, further comprising multiplexor circuit configured to select either of the first and second resistors, wherein the transmitted signal corresponds with the voltage across the selected first or second resistor.

9. The circuit of claim 1, further comprising a switch configured to selectively connect the driver to the first resistor.

10. The circuit of claim 1, wherein the magnitude of the injector current is based on a voltage across the first resistor.

11. The circuit of claim 1, wherein the magnitude of the injector current is based at least in part on a voltage generated by the driver.

12. A method of operating a force/sense circuit, the method comprising:

sourcing driver current through first and second resistors from a first power supply of a first voltage;

sourcing injector current through the second resistor from a second power supply of a second voltage, wherein the magnitude of the first voltage is greater than the magnitude of the second voltage;

conducting the driver current and the injector current to another circuit;

transmitting a signal corresponding with the sum of the driver current and the injector current;

sinking driver current through the first and second resistors to a third power supply of a third voltage;

sinking injector current through the second resistor to a fourth power supply of a fourth voltage, wherein the magnitude of the third voltage is greater than the magnitude of the fourth voltage; and conducting the driver current and the injector current from the other circuit.

13. The method of claim 12, wherein the injector current is sourced through the second resistor as a result of the driver current being greater than a threshold.

14. The method of claim 12, wherein the transmitted signal corresponds with the voltage across the second resistor.

15. The method of claim 12, further comprising, with a feedback loop, inducing a desired voltage at the other circuit as a result of the conducting of the driver current and the injector current to the other circuit.

16. The method of claim 12, further comprising selectively enabling and disabling the current injector.

17. The method of claim 12, further comprising selecting either of the first and second resistors, wherein the transmitted signal corresponds with the voltage across the selected first or second resistor.

18. The method of claim 12, further comprising selectively connecting the driver to the first resistor.

19. The method of claim 12, wherein the magnitude of the injector current is based on a voltage across the first resistor.

20. The method of claim 12, wherein the magnitude of the injector current is based at least in part on a voltage generated by the driver.

* * * * *